(12) United States Patent
Endo

(10) Patent No.: US 6,642,745 B2
(45) Date of Patent: Nov. 4, 2003

(54) SEMICONDUCTOR CIRCUIT AND PREDISCHARGE METHOD OF SEMICONDUCTOR CIRCUIT

(75) Inventor: Yukio Endo, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 5 days.

(21) Appl. No.: 10/124,452

(22) Filed: Apr. 18, 2002

(65) Prior Publication Data

US 2002/0153925 A1 Oct. 24, 2002

(30) Foreign Application Priority Data

Apr. 18, 2001 (JP) ........................................ 2001-119509

(51) Int. Cl.[7] ............................................. H03K 19/096
(52) U.S. Cl. ............................................. 326/98; 326/95
(58) Field of Search .............................. 326/93, 95, 98; 327/208–212, 214, 215, 224, 225

(56) References Cited

U.S. PATENT DOCUMENTS

| | | | |
|---|---|---|---|
| 5,392,423 A | * 2/1995 | Yetter | 713/503 |
| 5,821,778 A | * 10/1998 | Bosshart | 326/95 |
| 6,094,072 A | 7/2000 | Davies et al. | |
| 6,150,834 A | 11/2000 | Ciraula et al. | |
| 6,188,247 B1 | 2/2001 | Storino et al. | |
| 6,201,425 B1 | 3/2001 | Kartschoke et al. | |
| 6,496,041 B2 | * 12/2002 | Hirairi | 326/113 |

* cited by examiner

Primary Examiner—Vibol Tan
(74) Attorney, Agent, or Firm—Oblon, Spivak, McClelland, Maier & Neustadt, P.C.

(57) ABSTRACT

A semiconductor circuit includes: a first stage block including first stage dynamic circuits, configured to output a predischarged result to blocks cascade connected to later stages, each of the first stage dynamic circuit includes predischarge elements connected to dynamic nodes of the first stage dynamic circuits to predischarge the dynamic nodes, configured such that the dynamic nodes are precharged with a predetermined cycle; a predischarge signal generating circuit configured to generate a predischarge signal to actuate the respective predischarge elements before precharge timing of the dynamic nodes of the first stage dynamic circuits; and next stage blocks including next stage dynamic circuits, configured to output predischarge results to blocks cascade connected to later stages, each of the next stage dynamic circuit configured to input the predischarge result of the previous block so as to predischarge dynamic nodes, configured such that the dynamic nodes are precharged with a predetermined cycle.

18 Claims, 17 Drawing Sheets

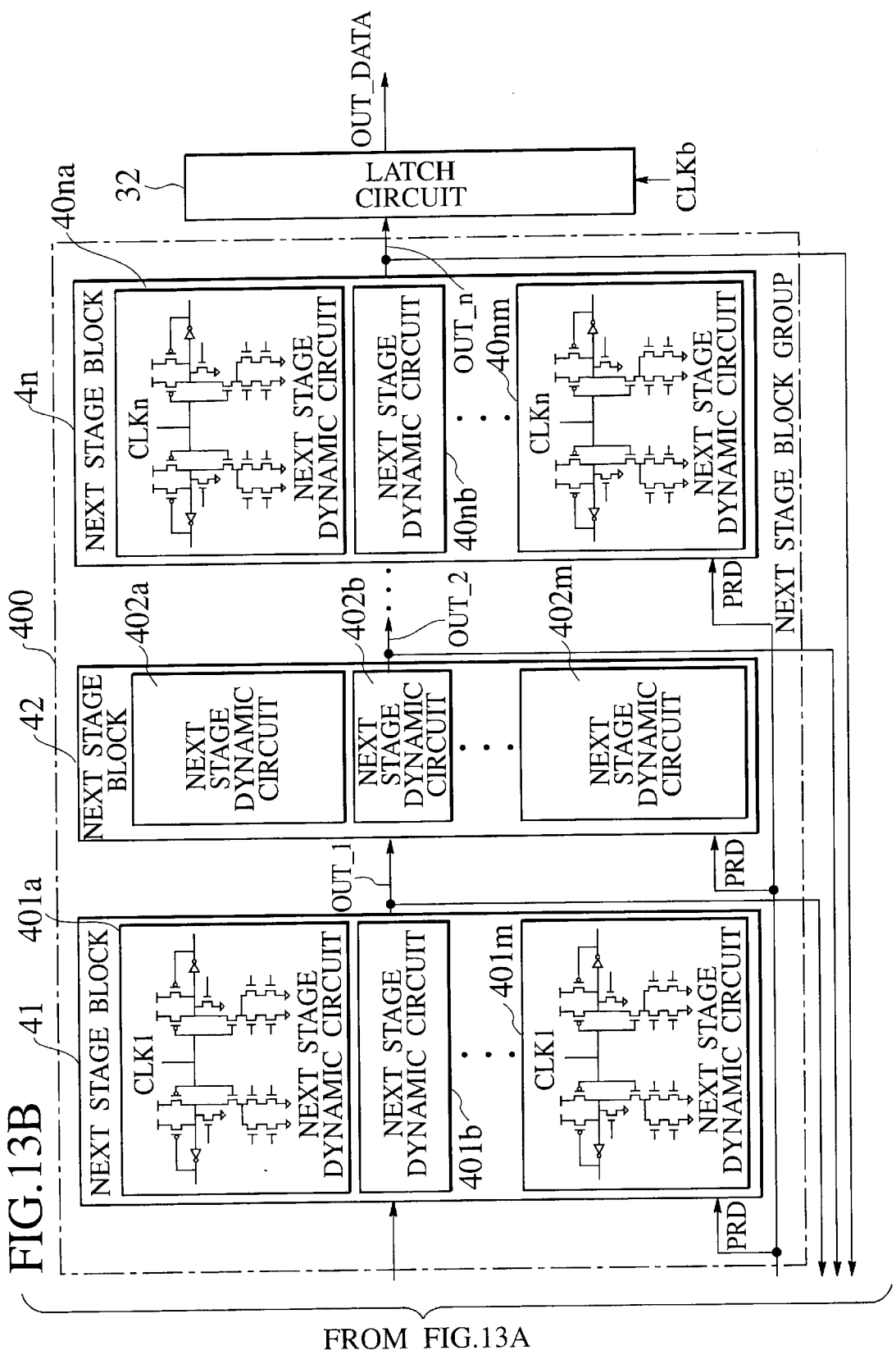

SEMICONDUCTOR CIRCUIT AND PREDISCHARGE METHOD OF SEMICONDUCTOR CIRCUIT

CROSS REFERENCE TO RELATED APPLICATIONS

This application claims benefit of priority under 35 USC §119 to Japanese Patent Application No. 2001-119509 filed on Apr. 18, 2001, the entire contents of which are incorporated by reference herein.

BACKGROUND OF THE INVENTION

1. Field of the Invention

The present invention pertains to a semiconductor circuit to which a Silicon On Insulator (SOI) technique is applied. Particularly, the invention pertains to a predischarge method of a dynamic circuit including n-channel transistors connected in series.

2. Description of Related Art

A typical example of a dynamic circuit including n-channel transistors connected in series is shown in FIG. 1. In FIG. 1, the dynamic circuit is implemented by an inverter Q103 as an output driver, p-channel transistors Q101 and Q102 which are connected with an input side of the inverter Q103, and a logic circuit section configured by connecting n-channel transistors Q104, Q105, Q106 and Q107 are connected in series. The p-channel transistor Q101 functions as a precharge circuit for precharging a dynamic node D10. The p-channel transistor Q102 is a leaker for maintaining the electric potential of the dynamic node D10. Gates of the n-channel transistors Q105, Q106 and Q107 are connected respectively to input terminals 51, 52 and 53, and an output of the inverter Q103 is connected to an output terminal 54. Moreover, a clock signal CLK is input into a gate of the p-channel transistor Q101 and a gate of the n-channel transistor Q104.

When the clock signal CLK to be input into the gate of the p-channel transistor Q101 is at a low level, the p-channel transistor Q101 is turned ON and the precharge circuit is actuated. As a result, the input side (dynamic node D10) of the inverter Q103 is precharged to a high level, an output side of the inverter Q103 is pulled down to a low level. The p-channel transistor Q102 is turned ON.

Nodes 0, 2 and 4 are pulled down to a low level, and nodes 1 and 3 can be possibly pulled up to a high level depending on the operating state before precharge.

When the Clock signal CLK becomes a high level, an evaluation period begins, in this state, the node 4 is pulled up to a high level and the n-channel transistor Q107 is turned ON, and when the node 3 is changed to a low level, an electric current flows from the node 1 to the node 3 due to bipolar action. Similarly, an electric current flows from a node between the n-channel transistors Q104 and Q105 to the node 1, as a result, noise is mixed into an electric potential of the dynamic node D10. Since this electric current is supplied from the precharge circuit side, an electric potential of the input side of the inverter Q103 becomes unstable, and noise is mixed into the output of the inverter Q103. This causes malfunction of circuits in later stages.

Therefore, in order to prevent malfunction, a p-channel transistor Q108 for predischarge actuated by a clock signal CLK is connected to an intermediate node, in this example to the node 1 as shown in FIG. 2. As a result, during precharge in a state where the clock signal CLK is at a low level, the p-channel transistor Q108 is turned ON, so that the node 1 is pulled down to a low level. With such a configuration, even if the node 3 is changed to a low level, since the node 1 was already at a low level at this time, the electric current does not flow from the node 1 to the node 3.

However, in the configuration shown in FIG. 2, when the p-channel transistor Q108 is added to each intermediate node, wiring should be connected to each intermediate node, so that a layout area increases. Moreover, in a case where the configuration of the logic circuit section implemented by connecting n-channel transistors in series becomes complicated, a lot of p-channel transistors for predischarge need to be connected to the intermediate nodes, so that circuit dimensions become large.

SUMMARY OF THE INVENTION

A semiconductor circuit according to an embodiment of the present invention includes: a first stage block including a plurality of first stage dynamic circuits and configured to output a predischarged result of the respective first stage dynamic circuits to blocks cascade connected to later stages, each of the first stage dynamic circuit includes predischarge elements connected respectively to dynamic nodes of the respective first stage dynamic circuits to predischarge the dynamic nodes, configured such that the dynamic nodes of the respective first stage dynamic circuits are precharged with a predetermined cycle; a predischarge signal generating circuit configured to generate a predischarge signal to actuate the respective predischarge elements before precharge timing of the respective dynamic nodes of the respective first stage dynamic circuits; and at least more than one next stage blocks including a plurality of next stage dynamic circuits and configured to output predischarge results of the respective next stage dynamic circuits sequentially to blocks cascade connected to later stages, each of the next stage dynamic circuit configured to input the predischarge result of the previous block so as to predischarge dynamic nodes of the respective next stage dynamic circuits, configured such that the dynamic nodes of the respective next stage dynamic circuits are precharged with a predetermined cycle.

In addition, a semiconductor circuit according to another embodiment of the present invention includes: a first stage block including a plurality of first stage dynamic circuits and configured to output a predischarge result in the respective first stage dynamic circuits to blocks cascade connected to later stages, each of the first stage dynamic circuit configured to input predischarge data so as to predischarge dynamic nodes of the respective first stage dynamic circuits, configured such that the dynamic nodes of the respective first stage dynamic circuits are precharged with a predetermined cycle and; a predischarge data input circuit configured to generate the predischarge data and to input the predischarge data into the first stage block; a predischarge signal generating circuit configured to generate a predischarge signal to actuate the predischarge data input circuit before precharge timing of the respective dynamic nodes of the respective first stage dynamic circuits; and at least more than one next stage blocks including a plurality of next stage dynamic circuits and configured to output predischarge results of the respective next stage dynamic circuits sequentially to blocks cascade connected to later stages, each of the next stage dynamic circuit configured to input the predischarge result of the previous block so as to predischarge dynamic nodes of the respective next stage dynamic circuits, configured such that the dynamic nodes of the respective next stage dynamic circuits are precharged with a predetermined cycle.

Further, a semiconductor circuit according to another embodiment of the present invention includes: a first stage block including a plurality of first stage dynamic circuits, each of the first stage dynamic circuit includes predischarge elements connected respectively to dynamic nodes of the respective first stage dynamic circuits to predischarge the dynamic nodes, configured such that the dynamic nodes of the respective first stage dynamic circuits are precharged with a predetermined cycle; at least more than one next stage blocks including a plurality of next stage dynamic circuits, each of the next stage dynamic circuit includes predischarge elements connected respectively to dynamic nodes of the respective next stage dynamic circuits to predischarge the dynamic nodes, configured such that the dynamic nodes of the respective next stage dynamic circuits are precharged with a predetermined cycle; and a predischarge signal generating circuit configured to generate a predischarge signal to actuate the respective predischarge elements of the respective first stage dynamic circuits and the respective next stage dynamic circuits before precharge timing of the respective dynamic nodes of the respective first stage dynamic circuits and the respective next stage dynamic circuits.

In addition, a method for predischarging a semiconductor circuit according to an embodiment of the present invention, the semiconductor circuit configured such that plural-stage blocks including a plurality of dynamic circuits are cascade connected and dynamic nodes of the respective dynamic circuits are precharged with a predetermined cycle, the method includes: generating a predischarge signal to actuate predischarge elements for predischarging the respective dynamic nodes before precharge timing of the respective dynamic nodes in a first stage block of the plural-stage blocks; inputting the predischarge signal to predischarge the respective dynamic nodes in the first stage block; outputting a predischarge result in the first stage block to a block cascade connected to a later stage; and inputting the predischarge result to predischarge the respective dynamic nodes in a next stage block of the plural-stage blocks and outputting the predischarge result to a later stage block where the later stage block is cascade connected.

Further, a method for predischarging a semiconductor circuit of another embodiment of the present invention, the semiconductor circuit configured such that plural-stage blocks including a plurality of dynamic circuits are cascade connected and dynamic nodes of the respective dynamic circuits are precharged with a predetermined cycle, the method includes: generating a predischarge signal before precharge timing of the respective dynamic nodes in a first stage blocks of the plural-stage blocks and creating predischarge data to predischarge the respective dynamic nodes; inputting the predischarge data to predischarge the respective dynamic nodes in the first stage block; outputting a predischarge result in the first stage block to a block cascade connected to a later stage; and inputting the predischarge result to predischarge the respective dynamic nodes in a next stage block of the plural-stage blocks and outputting the predischarge result to a later stage block where the later stage block is cascade connected.

Furthermore, a method for predischarging a semiconductor circuit of another embodiment of the present invention, the semiconductor circuit configured such that plural-stage blocks including a plurality of dynamic circuits are cascade connected and dynamic nodes of the respective dynamic circuits are precharged with a predetermined cycle, the method includes: generating a predischarge signal to actuate predischarge elements for predischarging the respective dynamic nodes before precharge timing of the respective dynamic nodes in the all plural-stage blocks; and inputting the predischarge signal to predischarge the respective dynamic nodes in the all blocks.

BRIEF DESCRIPTION OF THE DRAWINGS

FIG. 13B is a schematic configuration showing an example of an output side latch circuit and next stage block group in the semiconductor circuit shown in FIG. 12.

DETAILED DESCRIPTION

There will be explained below embodiments of the present invention with reference to the drawings. It is to be

First Embodiment

Figure 1:
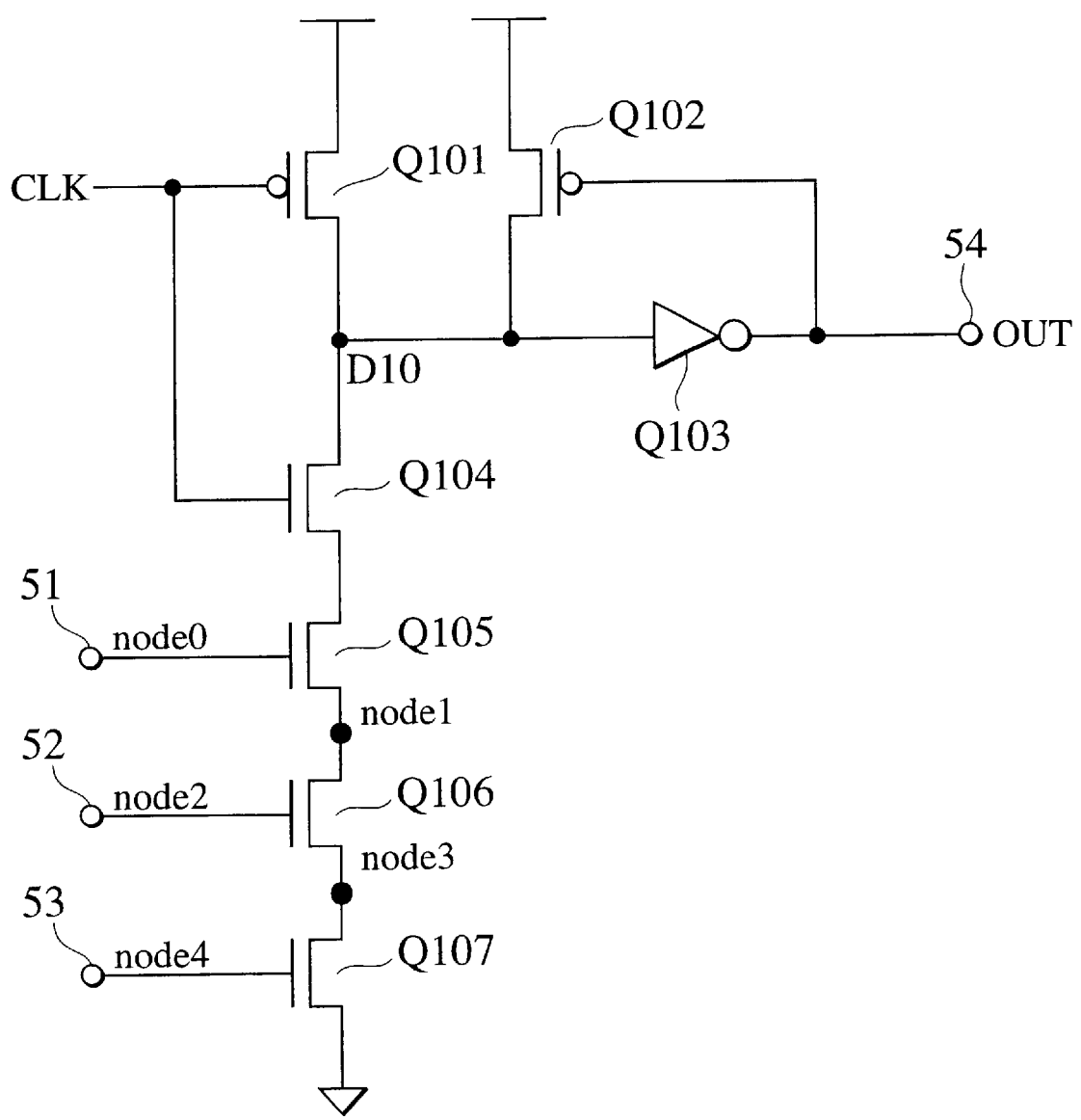
FIG. 1 is a schematic configuration showing a typical example of a dynamic circuit, and illustrating a circuit in which n-channel transistors are connected in series.
Figure 2:
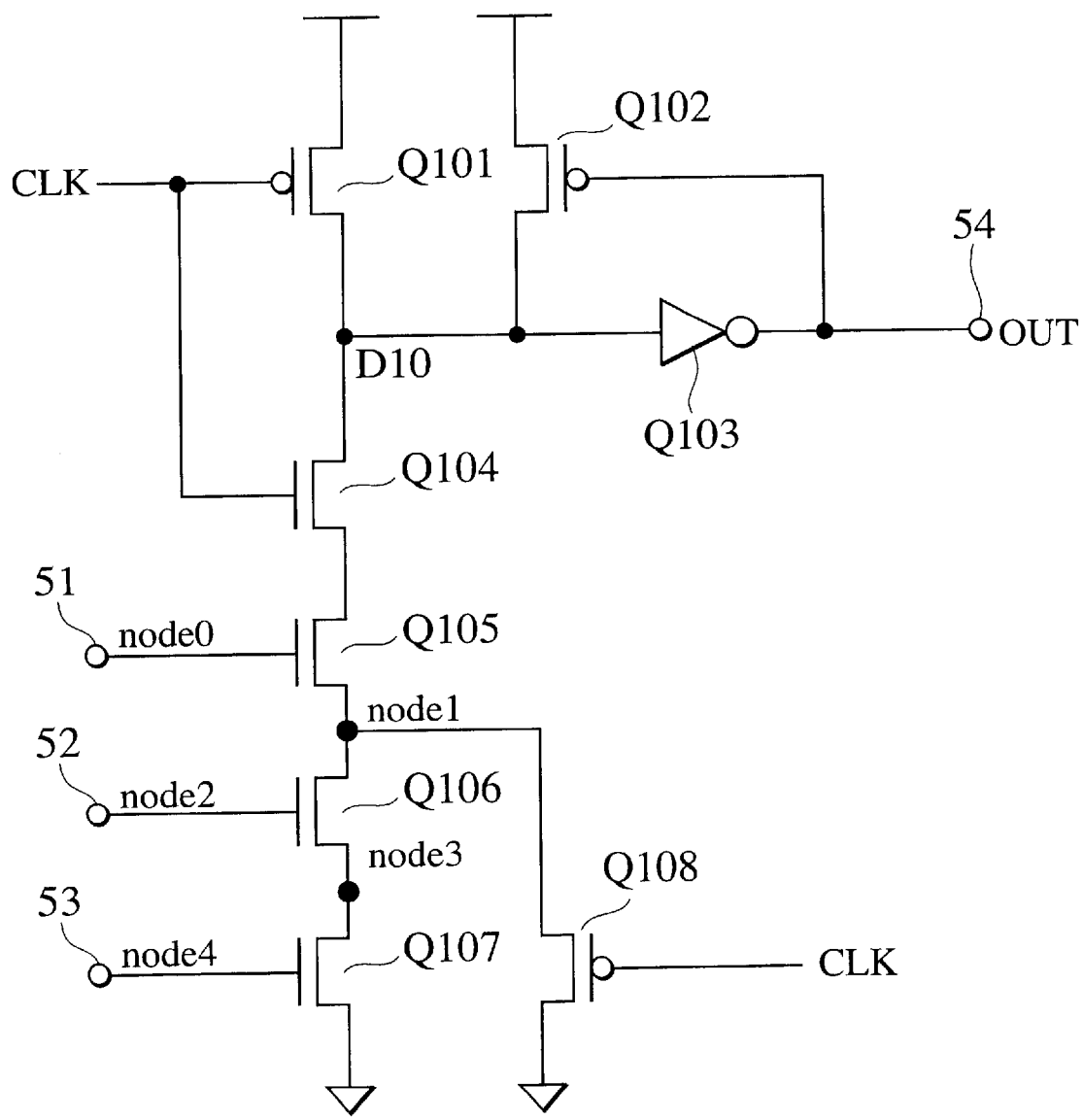
FIG. 2 is a schematic configuration showing an example in a case where a p-channel transistor predischarging a dynamic node is provided in the semiconductor circuit shown in FIG. 1.
Figure 3:
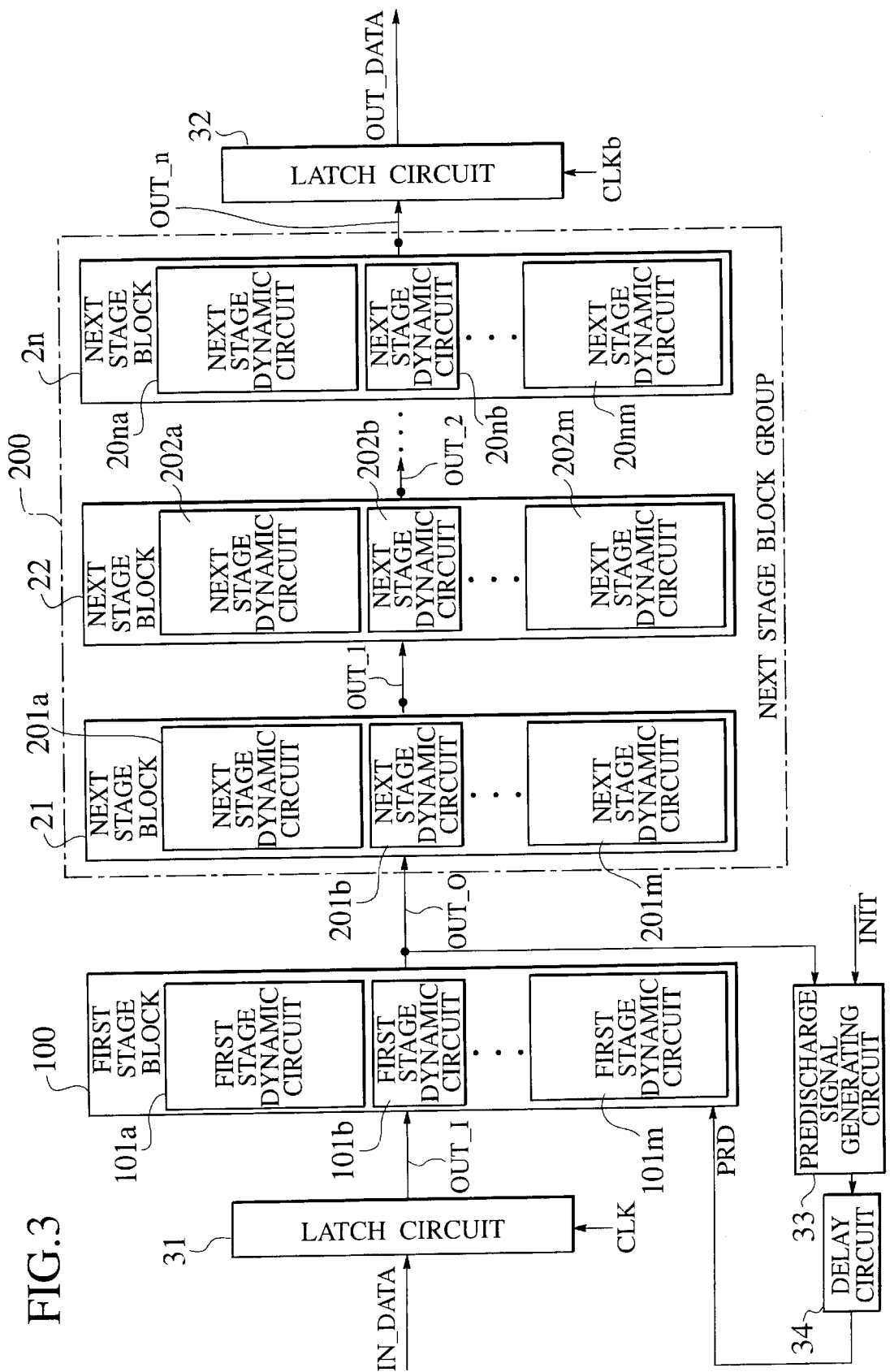
FIG. 3 is a schematic configuration showing an example of a semiconductor circuit according to a first embodiment.
Figure 4A:
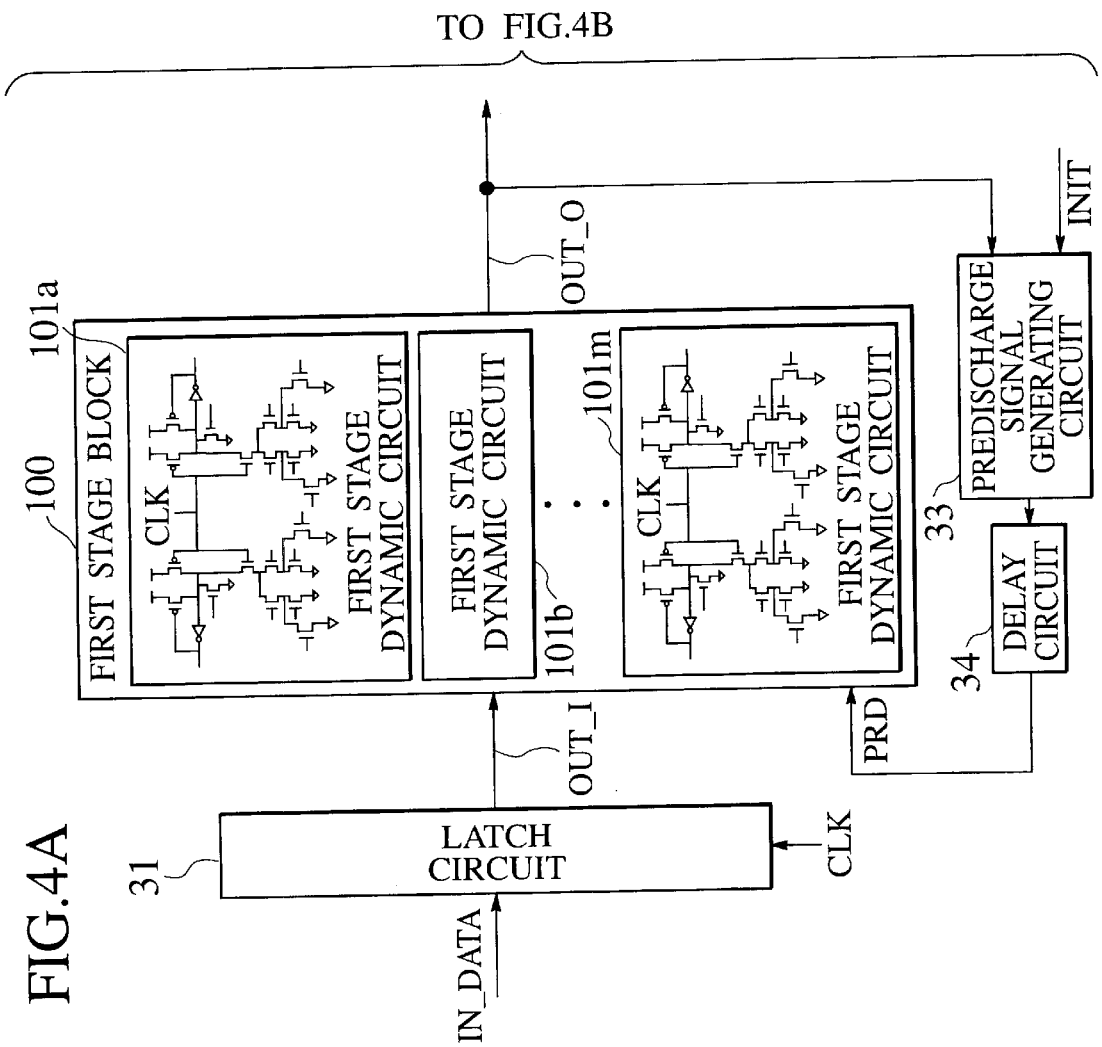
FIG. 4A is a schematic configuration showing an example of an input side latch circuit, a first stage block, a predischarge signal generating circuit, and a delay circuit in the semiconductor circuit shown in FIG. 3.
Figure 4B:
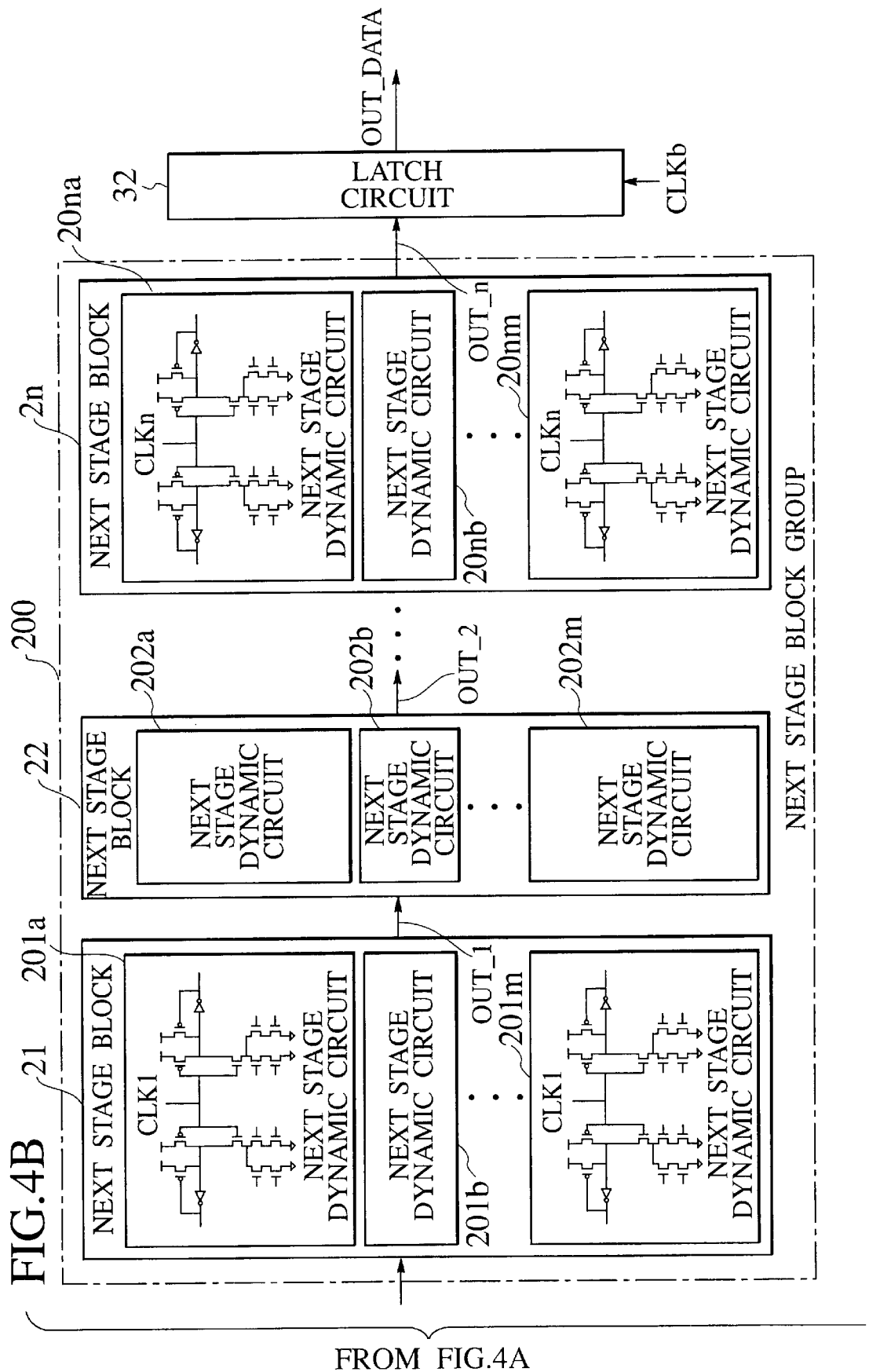
FIG. 4B is a schematic configuration showing an example of an output side latch circuit and next stage block group in the semiconductor circuit shown in FIG. 3.

As shown in FIGS. 3, 4A, and 4B, a semiconductor circuit according to the first embodiment includes a first stage block 100, next stage block group 200 which is cascade connected to the first stage block 100, an input side latch circuit 31, an output side latch circuit 32, a predischarge signal generating circuit 33, and a delay circuit 34.

An output of the input side latch circuit 31 is input into the first stage block 100, an output of the first stage block 100 is input into a next stage block 21 (top block) of the next stage block group 200. After this, an output of the next stage block 21 is input into a next stage block 22, an output of the next stage block 22 is input into a following block. The next stage blocks 21, 22, . . . , and 2n are connected with subordination, as for an output of the next stage block 2n (last block) is input into the output side latch circuit 32. The output of first stage block 100 is input into the predischarge signal generating circuit 33, an output of predischarge signal generating circuit 33 is input into the delay circuit 34. An output of the delay circuit 34 is input into the first stage block 100.

In the first stage block 100, a plurality of first stage dynamic circuits 101a, 101b, . . . , 101m are arranged(an example shown in FIG. 3, m pieces). In FIGS. 3 and 4A, the top first stage dynamic circuit 101a, second first stage dynamic circuit 101b, and last first stage dynamic circuits 101m are shown and, detailed configurations of third first stage dynamic circuit 101c, fourth first stage dynamic circuit 101d, . . . , are omitted in the first stage block 100. Each of the first stage dynamic circuit 101a, 101b, . . . , 101m is the same constitution except a logic circuit section.

The next stage block group 200 is configured such that the next stage blocks 21, 22, . . . , 2n are connected with subordination, and next stage dynamic circuits 201a, 201b, . . . , 201m are arranged in multiple pieces (an example shown in FIG. 3, m pieces) in the next stage block 21. Each of the next stage dynamic circuit 201a, 201b, . . . , 201m is the same circuit constitution respectively. Likewise, next stage dynamic circuits 202a, 202b, . . . , 202m are arranged in the next stage block 22 (second block) in the next stage block group 200, and next stage dynamic circuits 20na, 20nb, . . . , 20nm are arranged in the last block 2n in a similar constitution. In FIGS. 3 and 4B, top next stage dynamic circuits 201a, 202a, and 20na, second next stage dynamic circuits 201b, 202b, and 20nb, last next stage dynamic circuits 201m, 202m, and 20nm are shown and, detailed configurations of respective third next stage dynamic circuits 201c, 202c, and 20nc, fourth next stage dynamic circuits 201d, 202d, and 20nd, . . . , are omitted in each of block 21, 22, . . . , 2n. Further, first, second, and last next stage blocks 21, 22, and 2n are shown and, detailed configurations of third, fourth, . . . , next stage blocks 23, 24, . . . , are omitted in the next stage block group 200.

The input side latch circuit 31 operates in synchronization with a clock signal CLK and holds input data IN_DATA. The output side latch circuit 32 operates in synchronization with a clock signal CLKb and holds output data OUT_DATA.

The predischarge signal generating circuit 33 generates a predischarge signal PRD using a processed result OUT_O output from the first stage block 100 as the trigger and using an initializing signal INIT initializing the semiconductor circuit as the trigger. Namely, the predischarge signal PRD is generated so that predischarge is carried out before the precharge timing of the respective dynamic nodes D1 and D2. The predischarge signal PRD is a control signal for predischarging the dynamic nodes D1, D2 of respective first stage dynamic circuits 101a, 101b, . . . , 101m.

The delay circuit 34 delays the predischarge signal PRD generated by the predischarge signal generating circuit 33 by predetermined time so as to output the signal to the first stage block 100.

Figure 5:
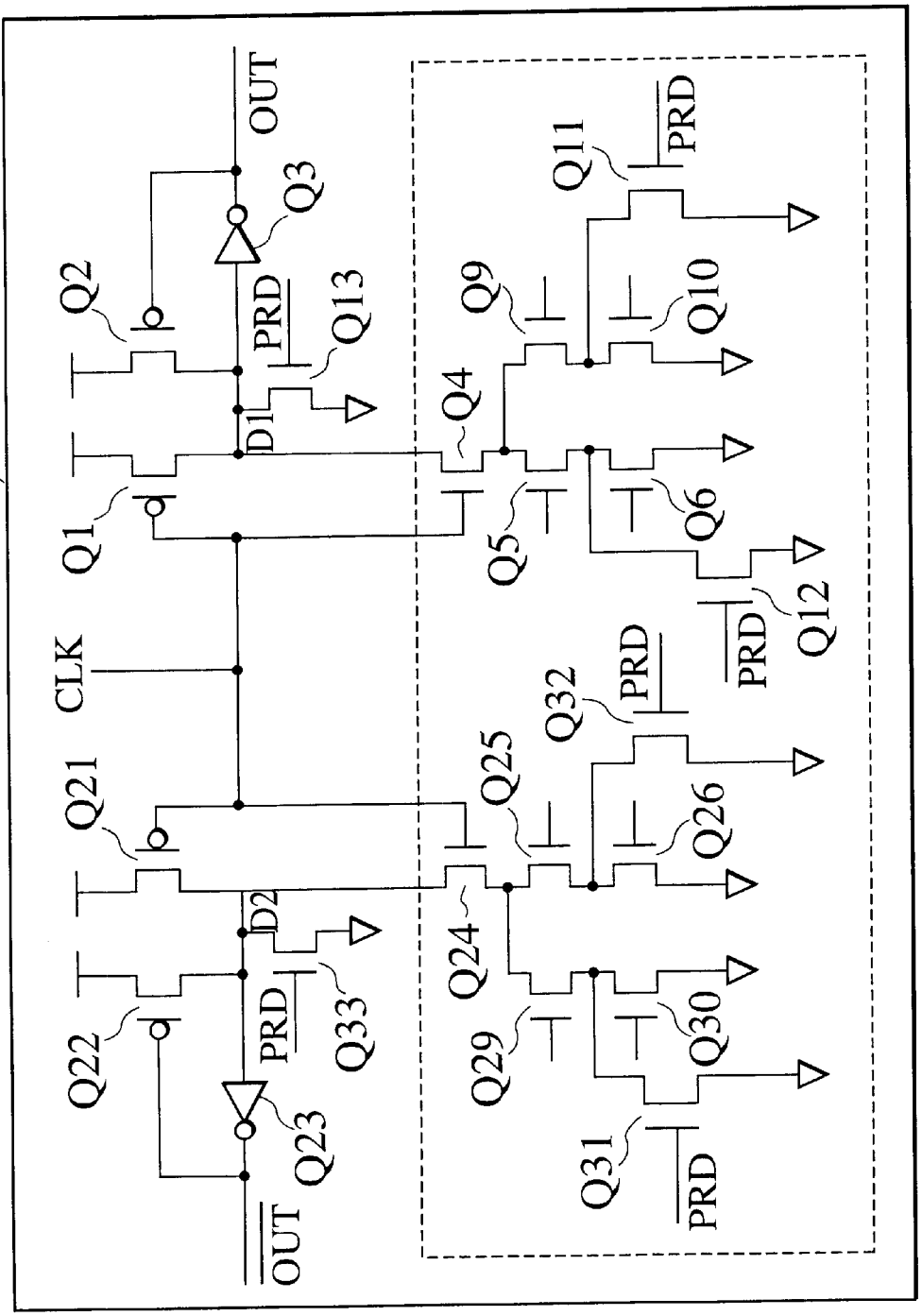
FIG. 5 is a schematic configuration showing an example of a first stage dynamic circuit composing the first stage block in the semiconductor circuit shown in FIG. 3.

As shown in FIG. 5, each of the first stage dynamic circuit 101a, 101b, . . . , 101m is implemented by an inverter Q3 as output driver, p-channel transistors Q1 and Q2 connected to the input side of the inverter Q3, and a logic circuit section configured by connecting n-channel transistors Q4, Q5, Q6, Q9 and Q10 in series. Further, the first stage dynamic circuits 101a, 101b, . . . , 101m are organized by an inverter Q23 as output driver for output (bar OUT) inverted from the output of inverter Q3, p-channel transistors Q21 and Q22 connected to the input side of the inverter Q23, and a logic circuit section configured by connecting n-channel transistors Q24, Q25, Q26, Q29 and Q30 in series.

The p-channel transistor Q1 of the first stage dynamic circuits 101a, 101b, . . . , 101m functions as a precharge circuit for precharging a dynamic node D1 on the input side of the inverter Q3 with a predetermined cycle. The p-channel transistor Q2 of the first stage dynamic circuits 101a, 101b, . . . , 101m is a leaker for maintaining the electric potentials of the dynamic node D1. Similarly, the p-channel transistor Q21 of the first stage dynamic circuits 101a, 101b, . . . , 101m functions as a precharge circuit for precharging a dynamic node D2 on the input side of the inverter Q23 with a predetermined cycle. The p-channel transistor Q22 of the first stage dynamic circuits 101a, 101b, . . . , 101m is a leaker for maintaining the electric potentials of the dynamic node D2.

In the first stage dynamic circuits 101a, 101b, . . . , 101m, the clock signal CLK is input into gates of the p-channel transistors Q1, Q21, and gates of the n-channel transistors Q4, Q24. Further, n-channel transistors Q11, Q12, Q13, Q31, Q32 and Q33 which are predischarge elements for predischarging the respective dynamic nodes D1 and D2 are connected respectively to the dynamic nodes in the first stage dynamic circuit 101a, 101b, . . . , 101m. The n-channel transistor Q13 of the first stage dynamic circuit 101a, 101b, . . . , 101m predischarges the input side node D1 of the inverter Q3. The n-channel transistor Q33 of the first stage dynamic circuit 101a, 101b, . . . , 101m predischarges the input side node D2 of the inverter Q23. The n-channel transistors Q11 and Q12 of the first stage dynamic circuit 101a, 101b, . . . , 101m predischarge the intermediate node of the n-channel transistors Q5 and Q6 and the intermediate node of the n-channel transistors Q9 and Q10 that compose the logic circuit section at a low level. In the first stage dynamic circuits 101a, 101b, . . . , 101m, further, the n-channel transistors Q31 and Q32 predischarge intermediate node of the n-channel transistors Q25 and Q26 and intermediate node of the n-channel transistors Q29 and Q30 that compose the logic circuit section at a low level.

As for a portion of the logic circuit section surrounded by a dotted line in FIG. 5, various configurations according to circuit logic can be considered.

Besides the next stage dynamic circuits 201a, 201b, . . . , 201m, 202a, 202b, . . . , 202m, . . . , 20na, 20nb, . . . , 20nm of each of the next stage block 21, 22, . . . , 2n not including the predischarge n-channel transistors Q11, Q12, Q13, Q31, Q32, Q33 owned by the first stage dynamic circuit 101a, 101b, . . . , 101m, the next stage dynamic circuits 201a, 201b, . . . , 201m, 202a, 202b, . . . , 202m, . . . , 20na, 20nb, . . . , 20nm are constituted the same as the first stage dynamic circuit 101a, 101b, . . . , 101m.

Figure 6:
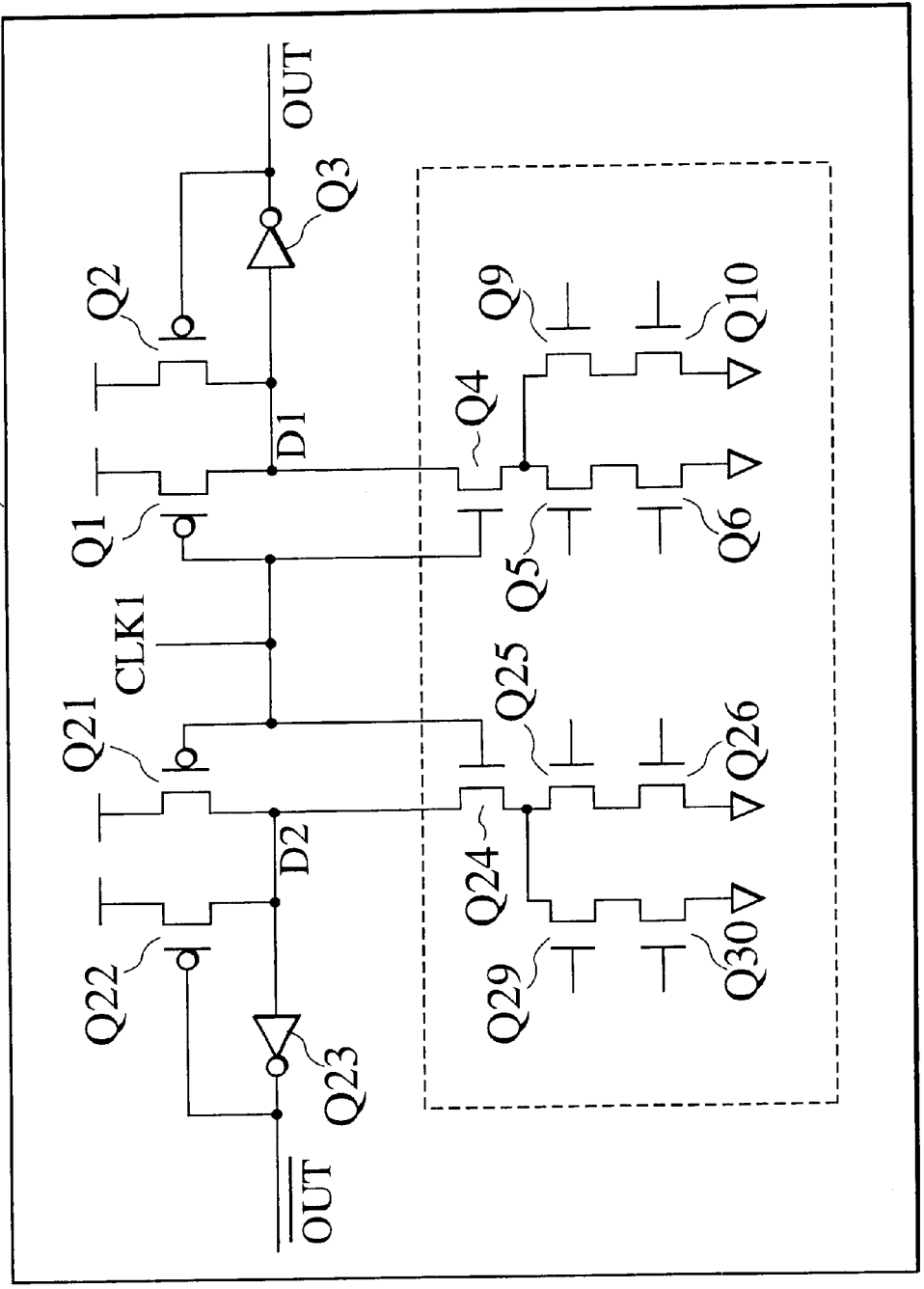
FIG. 6 is a schematic configuration showing an example of a next stage dynamic circuit composing a top block of the next stage block group in the semiconductor circuit shown in FIG. 3.

As shown in FIG. 6, each of the next stage dynamic circuit 201a, 201b, . . . , 201m embraces an inverter Q3 as the output driver, p-channel transistors Q1 and Q2 connected to the input side of the inverter Q3, and a logic circuit section configured by connecting n-channel transistors Q4, Q5, Q6, Q9 and Q10 in series. Further, each of the next stage dynamic circuit 201a, 201b, . . . , 201m encompasses further an inverter Q23 as the output driver for output (bar OUT) inverted from the output of inverter Q3, p-channel transistors Q21 and Q22 connected to the input side of the inverter Q23, and a logic circuit section configured by connecting n-channel transistors Q24, Q25, Q26, Q29 and Q30 in series.

The p-channel transistors Q1 and Q21 of the next stage dynamic circuits 201a, 201b, . . . , 201m function as precharge circuits for precharging the dynamic nodes D1 and D2. The p-channel transistors Q2 and Q22 of the next stage dynamic circuits 201a, 201b, . . . , 201m are leakers for maintaining the electric potential of the dynamic nodes D1 and D2. As for the logic circuit section surrounded by a dotted line in FIG. 6, various configurations can be considered according to circuit logic.

Figure 7:
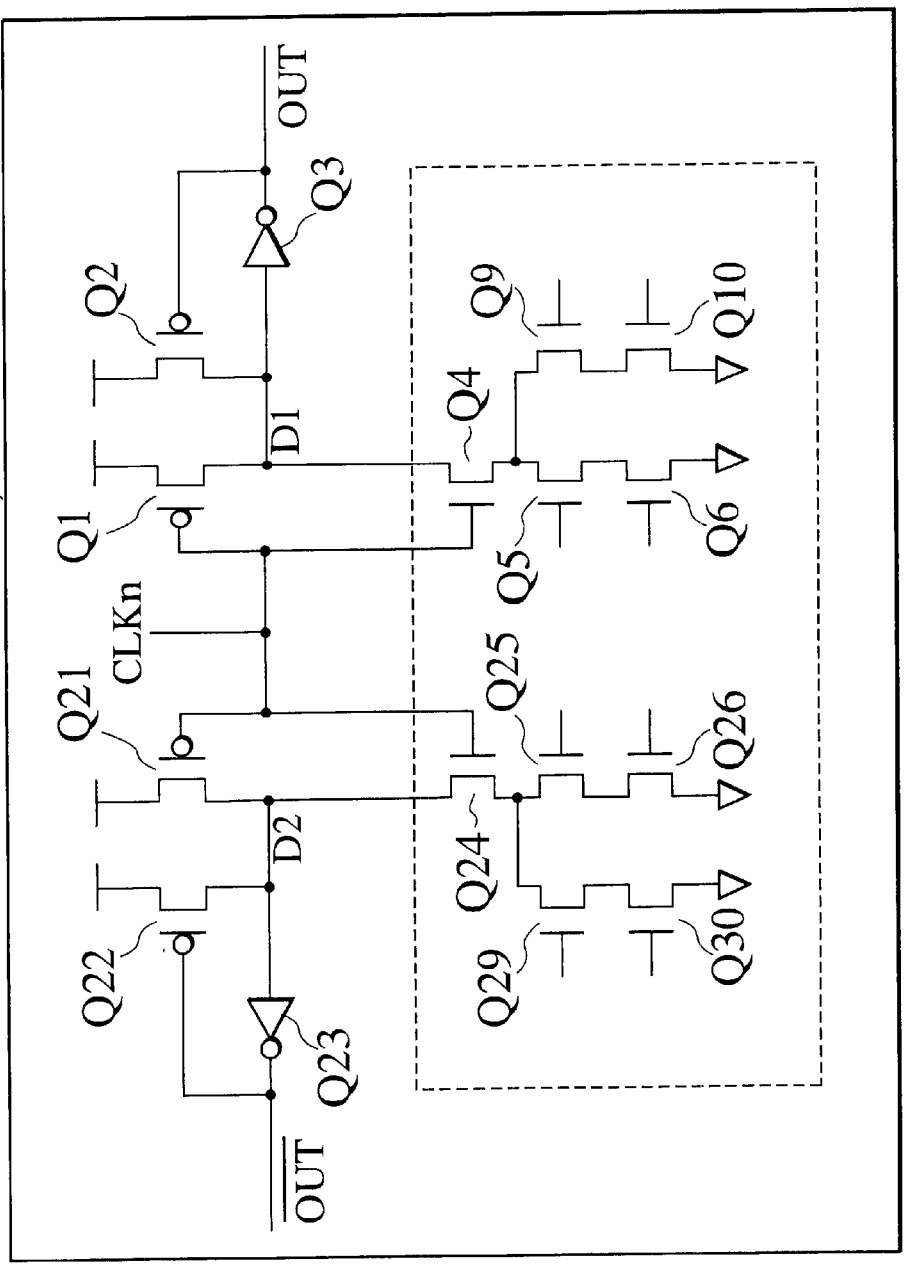
FIG. 7 is a schematic configuration showing an example of a next stage dynamic circuit composing a last block of the next stage block group in the semiconductor circuit shown in FIG. 3.

In the next stage dynamic circuits 201a, 201b, . . . , 201m, a clock signal CLK1 which delays from the clock signal CLK predetermined time is input into gates of the p-channel transistors Q1, Q21 and gates of the n-channel transistors Q4, Q24. Hereinafter, in each of the next stage block 22, . . . , of the next stage block group 200, clock signal CLK 2, . . . , of a delay that is different in each are input into gates of p-channel transistors Q1, Q21 and gates of n-channel transistors Q4, Q24 respectively. As shown in FIG. 7, a clock signal CLKn is input into gates of p-channel transistors Q1, Q21 and gates of n-channel transistors Q4, Q24 in the next stage dynamic circuits 20na, 20nb, . . . , 20nm.

Figure 8:
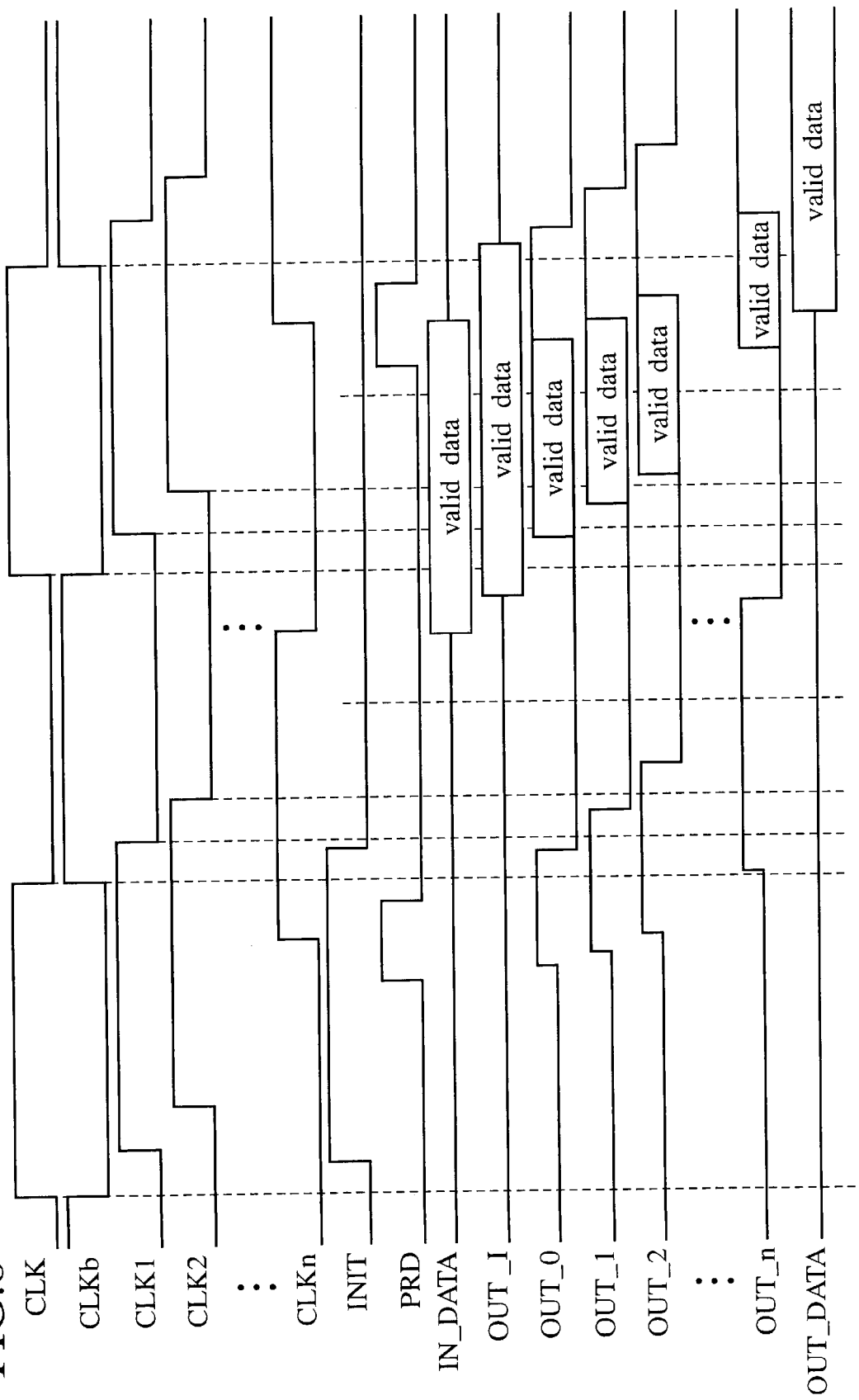
FIG. 8 is a timing chart showing an operating example of the semiconductor circuit shown in FIG. 3.

The operation of the semiconductor circuit will be explained below according to the first embodiment with reference to a timing chart of FIG. 8.

Firstly, the predischarge signal generating circuit 33 generates a predischarge signal PRD using the initializing signal INIT or the processed result OUT_O as the trigger, and the predischarge signal PRD delayed by the delay circuit 34 is brought to a high level for input into each of the first stage dynamic circuit 101a, 101b, . . . , 101m of the first stage block 100. As a result, the n-channel transistors Q13, Q33 which are the predischarge elements in each first stage dynamic circuit 101a, 101b, . . . , 101m is actuated (ON), and the input side nodes D1, D2 of the inverters Q3, Q33 are predischarged to a low level. At the same time, in the first stage dynamic circuit 101a, 101b, . . . , 101m, the predischarge n-channel transistors Q11 and Q12 are also actuated (ON), and the intermediate node of the n-channel transistors Q5 and Q6 composing the logic circuit section and the intermediate node of the n-channel transistors Q9 and Q10 are predischarged to a low level. Similarly, at the same time, in the first stage dynamic circuit 101a, 101b, . . . , 101m, the predischarge n-channel transistors Q31 and Q32 are also actuated (ON), and the intermediate node of the n-channel transistors Q25 and Q26 composing the logic circuit section and the intermediate node of the n-channel transistors Q29 and Q30 are predischarged to a low level.

For this reason, all bits of the outputs OUT_O from all the first stage dynamic circuits 101a, 101b, . . . , 101m pull up to a high level, and the outputs OUT_O are input into all the next stage dynamic circuits 201a, 201b, . . . , 201m in the next stage block 21.

As a result, all the n-channel transistors Q5, Q6, Q9, Q10, Q25, Q26, Q29 and Q30 composing the logic circuit section of each of the next stage dynamic circuit 201a, 201b, . . . , 201m are turned ON, and the input side nodes D1 and D2 of the inverters Q3 and Q23 are predischarged to a low level, and all bits of the outputs OUT_1 of the next stage dynamic circuits 201a, 201b, . . . , 201m are pulled up to a high level. Hereinafter, similarly predischarged results of the next stage dynamic circuits 201a, 201b, . . . , 201m (of which all bits are data at a high level) are sequentially output to the next stage dynamic circuits 202a, 202b, . . . , 202m in the next stage block 22 cascade connected to a later stage, and the dynamic nodes D1, D2 in all the next stage dynamic circuits 202a, 202b, . . . , 202m, . . . , 20na, 20nb, . . . , 20nm in all the next stage blocks 22, . . . , 2n are predischarged, so that all outputs OUT_2, . . . , OUT_n are pulled up to a high level.

Thereafter, when the clock signal CLK is pulled down to a low level, the p-channel transistors Q1, Q2, Q21 and Q22 in each first stage dynamic circuit 101a, 101b, . . . , 101m are turned ON, and since the input side nodes D1 and D2 of the inverters Q3 and Q23 are precharged to a high level, all bits of the output OUT_O of the respective first stage dynamic circuits 101a, 101b, . . . , 101m are pulled down to a low level. Since the clock signals CLK1, CLK2, . . . , CLKn are sequentially pulled down to a low level in a state delayed by a predetermined time period from the moment that the clock signal CLK is pulled down to a low level, the p-channel transistors Q1, Q2, Q21 and Q22 in each next stage dynamic circuit 201a, 201b, . . . , 201m in the next stage block 21 are turned ON. Since the input sides of the inverters Q3 and Q23 are precharged to a high level, all bits of the outputs OUT_1 of the respective next stage dynamic circuits 201a, 201b, . . . , 201m in the next stage block 21 are pulled down to a low level. Hereinafter, similarly predischarged results of the next stage dynamic circuits 201a, 201b, . . . , 201m are sequentially output to the next stage dynamic circuits 202a, 202b, . . . , 202m in the next stage block 22 cascade connected to a later stage, so that all outputs OUT_2, . . . , OUT_n are pulled down to a low level.

Thereafter, when input data IN_DATA is latched by the input side latch circuit 31, input data OUT_1 is input into the respective first stage dynamic circuits 101a, 101b, . . . , 101m in the first stage block 100, and the processed result OUT_O of the first stage dynamic circuits 101a, 101b, . . . , 101m becomes input data of the next stage block 21 so as to be input into the respective next stage dynamic circuits 201a, 201b, . . . , 201m. Hereinafter, similarly data OUT_n which is the processed result of the respective next stage dynamic circuits 20na, 20nb, . . . , 20nm in the next stage block 2n is finally output so as to be latched by the output side latch circuit 32.

When the processed result OUT_O of the first stage dynamic circuits 101a, 101b, . . . , 101m are output from the first stage block 100, the predischarge signal generating circuit 33 generates a next predischarge signal PRD, the predischarge signal PRD delayed by the delay circuit 34 is pulled up to a high level and is input into the respective first stage dynamic circuits 101a, 101b, . . . , 101m in the first stage block 100, so that the above operation is repeated. When a power source is turned on, an initializing signal INIT is input into the predischarge signal generating circuit 33, so that the first predischarge signal PRD at a high level is generated.

The timing at which the predischarge signal generating circuit 33 generates the predischarge signal PRD is not limited to the timing at which the processed result OUT_O output from the first stage block 100 is input. Taking the processing time or the like in the respective blocks 100, 21, 22, . . . , 2n into consideration, the predischarge signal PRD may be generated using one of the outputs OUT_O, OUT_1, OUT_n in the first stage block 100 to the next stage blocks 21, . . . , 2n as the trigger.

According to the first embodiment, even if the dynamic circuits 201a, 201b, . . . , 201m, 202a, 202b, . . . , 202m, . . . , 20na, 20nb, . . . , 20nm other than the dynamic circuits in the first stage block 100 do not include predischarge elements, the circuits 201a, 201b, . . . , 201m, 202a, 202b, . . . , 202m, . . . , 20na, 20nb, . . . , 20nm are predischarged by predischarging the previous stage circuits, so that the area of the entire circuit can be reduced. Furthermore, a malfunction of the circuits can be eliminated, and reliability of the circuit can be improved. Moreover, since the predischarge elements are eliminated from the dynamic circuits 201a, 201b, . . . , 201m, 202a, 202b, . . . , 202m, . . . , 20na, 20nb, . . . , 20nm in the later stage blocks and the loads on the intermediates nodes are reduced, the speed of the circuit operation can be heightened.

Second Embodiment

Figure 9:
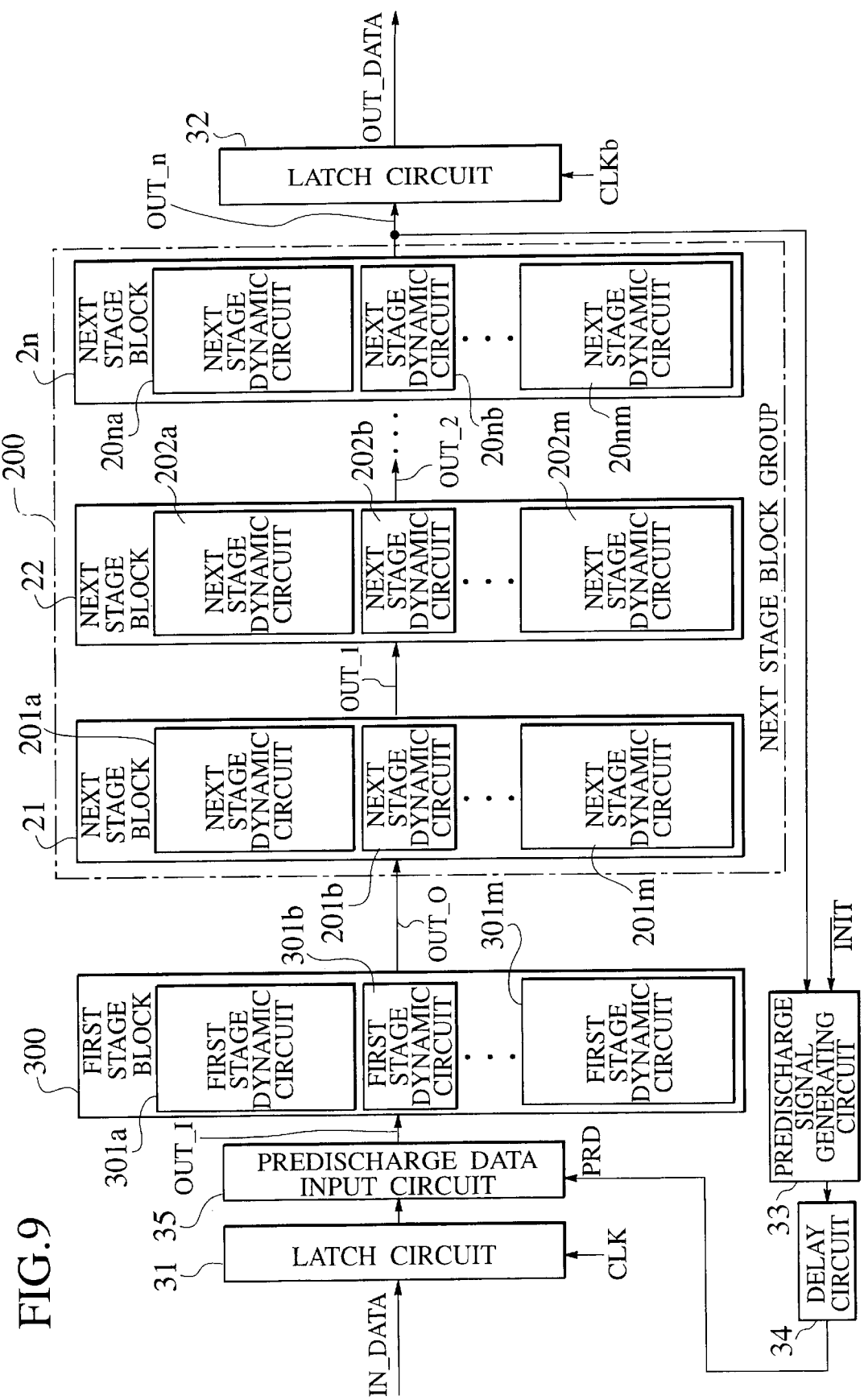
FIG. 9 is a schematic configuration showing an example of the semiconductor circuit according to a second embodiment.
Figure 10A:
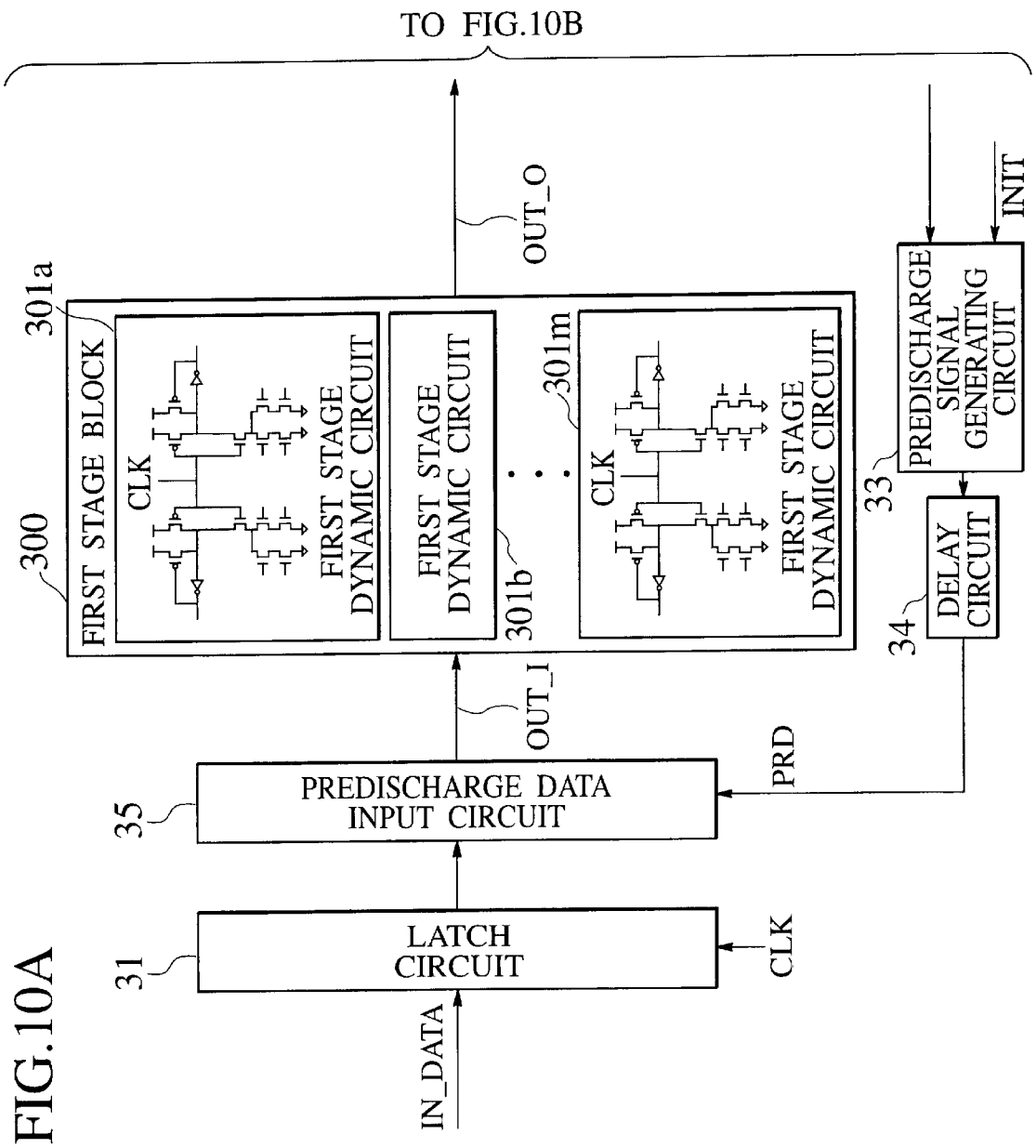
FIG. 10A is a schematic configuration showing an example of an input side latch circuit, a predischarge data input circuit, a first stage block, a predischarge signal generating circuit, and a delay circuit in the semiconductor circuit shown in FIG. 9.
Figure 10B:
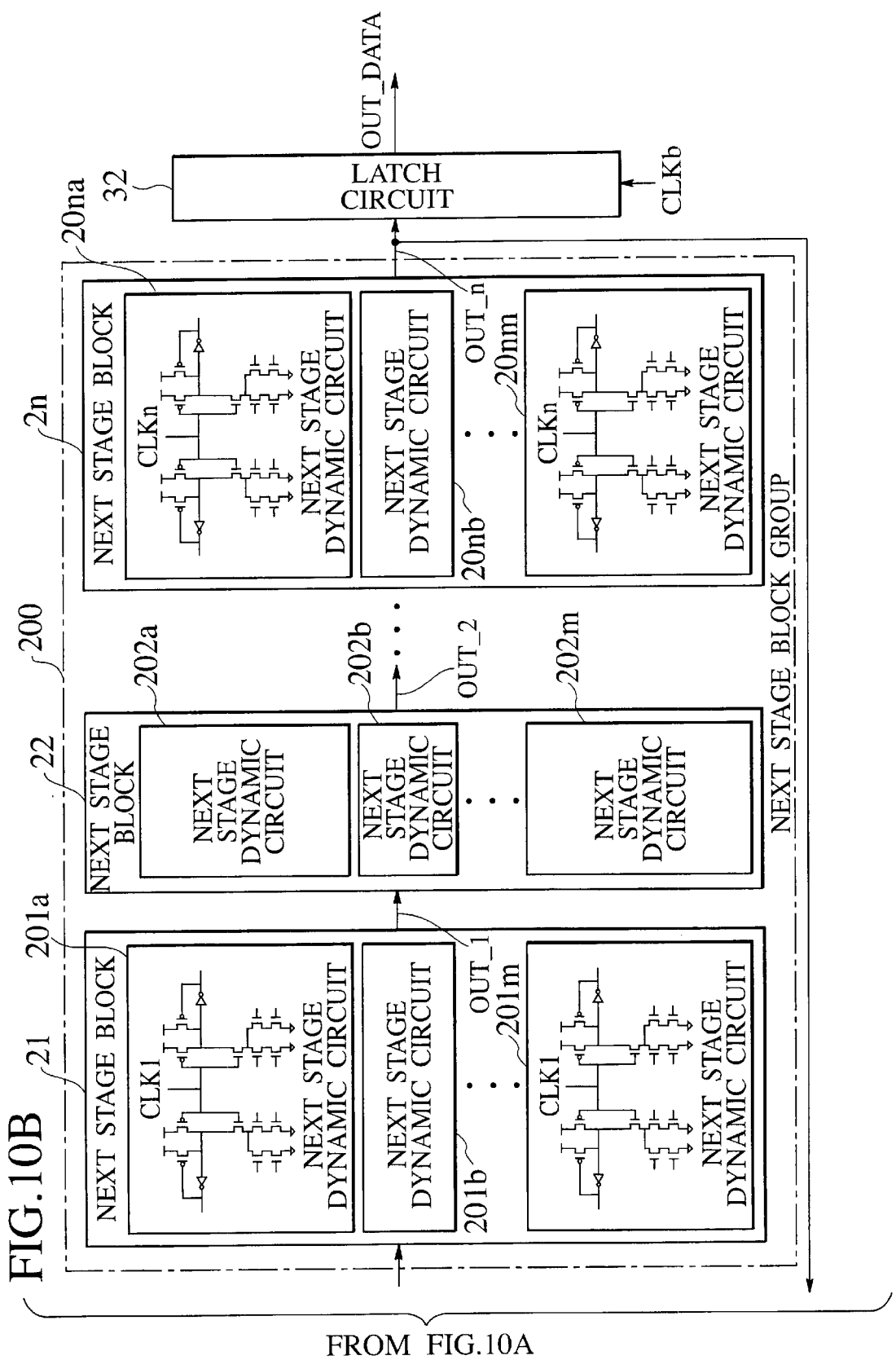
FIG. 10B is a schematic configuration showing an example of an output side latch circuit and next stage block group in the semiconductor circuit shown in FIG. 9.

As shown in FIGS. 9, 10A, and 10B, a semiconductor circuit according to a second embodiment includes a first stage block 300, next stage block group 200 cascade connected to the first stage block 300, an input side latch circuit 31 and an output side latch circuit 32, a predischarge signal generating circuit 33 and a delay circuit 34. Further, a predischarge data input circuit 35 is inserted between the input side latch circuit 31 and the first stage block 300, and a predischarge signal PRD output from the delay circuit 34 is input into the predischarge data input circuit 35.

Figure 11:
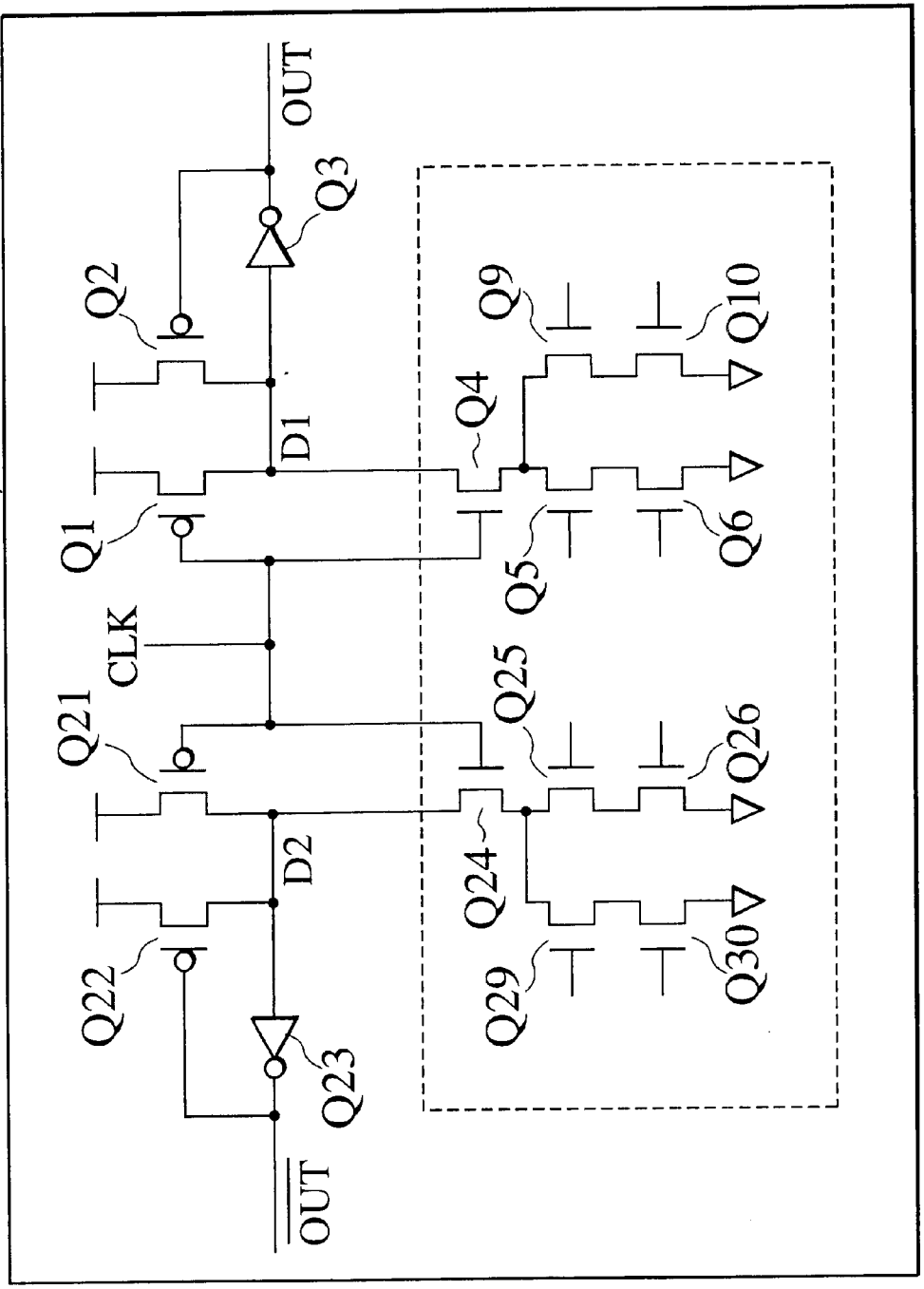
FIG. 11 is a schematic configuration showing an example of a first stage dynamic circuit composing the first stage block in the semiconductor circuit shown in FIG. 9.

As shown in FIG. 11, besides the first stage dynamic circuits 301a, 301b, . . . , 301m of the first stage block 300 not including the predischarge n-channel transistors Q11, Q12, Q13, Q31, Q32, Q33 owned by the first stage dynamic circuit 101a, 101b, . . . , 101m of the first stage block 100 according to the first embodiment shown in FIG. 5, the first stage dynamic circuits 301a, 301b, . . . , 301m are constituted the same as the first stage dynamic circuit 101a, 101b, . . . , 101m according to the first embodiment.

Next stage dynamic circuits 201a, 201b, . . . , 201m, 202a, 202b, . . . , 202m, . . . , 20na, 20nb, . . . , 20nm are constituted the same as the next stage dynamic circuits 201a, 201b, . . . , 201m, 202a, 202b, . . . , 202m, . . . , 20na, 20nb, . . . , 20nm according to the first embodiment shown in FIG. 3 are arranged in respective next stage blocks 21, 22, . . . , 2n.

Moreover, clock signals CLK, CLK1, . . . , CLKn of which delays are different are input into the first stage block 300 and the respective next stage blocks 21, 22, . . . , 2n.

There will be explained below an operation of the semiconductor circuit according to the second embodiment The operational timing of the semiconductor circuit in the second embodiment is the same as the operational timing of the timing chart shown in FIG. 8.

Firstly the predischarge signal generating circuit 33 generates a predischarge signal PRD at a high level using an initializing signal INIT or a processed result OUT_O as the trigger, and the predischarge signal PRD delayed by the delay circuit 34 is output to the predischarge data input circuit 35. When the predischarge signal PRD at a high level is input, the predischarge data input circuit 35 outputs data of which all bits are at a high level to the first stage block 300. As a result, n-channel transistors Q5, Q6, Q9 and Q10 composing the logic circuit sections of the respective first stage dynamic circuits 301a, 301b, . . . , 301m in the first stage block 300 are turned ON, and an input side node D1 of an inverter Q3 is predischarged at a low level. Similarly, n-channel transistors Q25, Q26, Q29 and Q30 composing the logic circuit sections of the respective dynamic circuits 301a, 301b, . . . , 301m in the first stage block 300 are turned ON, and an input side node D2 of an inverter Q23 is predischarged at a low level.

As a result, all bits of the output OUT_O of the respective first stage dynamic circuits 301a, 301b, . . . , 301m in the first stage block 300 become data at a high level so as to be input into the next stage block 21. For this reason, a n-channel transistors Q5, Q6, Q9, Q10, Q25, Q26, Q29 and Q30 composing the logic circuit sections of all the next stage dynamic circuits 201a, 201b, . . . , 201m in the next stage block 21 are turned ON, and respective input side nodes D1, D2 of the inverters Q3, Q23 are predischarged at a low level. All bits of output data OUT_1 of all the next stage dynamic circuits 201a, 201b, . . . , 201m are pulled up to a high level. Hereinafter, similarly the dynamic nodes D1 and D2 of all the next stage dynamic circuits 202a, 202b, . . . , 202m, . . . , 20na, 20nb, . . . , 20nm in the next stage blocks 22, . . . , 2n are sequentially predischarged, so that all bits of output data OUT_2, . . . , OUT_n of the respective next stage blocks 22, . . . , 2n become high level.

Thereafter, when the clock signal CLK is pulled down to a low level, the p-channel transistors 1 and 2 of the respective dynamic circuits 301a, 301b, . . . , 301m in the first stage block 300 are turned ON, and the input side nodes D1 and D2 of the inverters Q3 and Q23 are precharged to a high level, so that all bits of the output data of the respective first stage dynamic circuits 301a, 301b, . . . , 301m become low level. Since the clock signals CLK1, CLK2, . . . , CLKn are pulled down to a low level sequentially being delayed by predetermined time from the moment that the clock signal CLK is pulled down to a low level, the p-channel transistors Q1, Q2, Q21, and Q22 of the respective next stage dynamic circuits 201a, 201b, . . . , 201m in the next stage block 21 are turned ON, and the input side nodes D1, D2 of the inverters Q3, Q23 are precharged to a high level. For this reason, all bits of output OUT_1 of the respective next stage dynamic circuits 201a, 201b, . . . , 201m are pulled down to a low level. Hereinafter, similarly the precharged result is output sequentially to blocks cascade connected to later stages, and the outputs OUT_2, . . . , OUT_n of all the next stage dynamic circuits 202a, 202b, . . . , 202m, . . . , 20na, 20nb, . . . , 20nm in the next stage blocks 22, . . . , 2n are pulled down to a low level sequentially.

Thereafter, when input data IN_DATA is latched by the input side latch circuit 31, the predischarge signal PRD input into the predischarge data input circuit 35 is pulled down to a low level, and the predischarge data input circuit 35 allows the input data IN_DATA latched by the input side latch circuit 31 through so as to input the input data IN_DATA into the first stage block 300. In such a manner the input data is input into the first stage dynamic circuits 301a, 301b, . . . , 301m in the first stage block 300, and the processed result OUT_O of the first stage dynamic circuits 301a, 301b, . . . , 301m becomes input data of the next stage block 21 so as to be input into the next stage dynamic circuits 201a, 201b, . . . , 201m of the next stage block 21. Hereinafter, similarly the data OUT_n as the processed data of the next stage dynamic circuits 20na, 20nb, . . . , 20nm in the next stage block 2n is finally output so as to be latched by the output side latch circuit 32.

When the processed result OUT_n of the dynamic circuits 20na, 20nb, . . . , 20nm as data are output from the next stage block 2n, the predischarge signal generating circuit 33 generates a next predischarge signal PRD at a high level, and the predischarge signal PRD delayed by the delay circuit 34 is input into the respective first stage dynamic circuits 101a, 101b, . . . , 101m in the first stage block 300, so that the above operation is repeated. When the power source is turned ON, the initializing signal INIT is input into the predischarge signal generating circuit 33, so that the first predischarge signal PRD at a high level is generated.

The timing at which the predischarge signal generating circuit 33 generates the predischarge signal PRD is not limited to the timing at which the processed result OUT_n output from the next stage block 2n is input. Taking the processing time or the like in the respective blocks 300, 21, 22, . . . , 2n into consideration, the predischarge signal PRD may be generated using one of the outputs OUT_0, OUT_1, . . . , OUT_n in the first stage block 300 and the next stage blocks 21, 22, . . . , 2n as the trigger.

According to the second embodiment, even if all the first stage dynamic circuits 301a, 301b, . . . , 301m and all the next stage dynamic circuits 201a, 201b, . . . , 201m, 202a, 202b, . . . , 202m, . . . , 20na, 20nb, . . . , 20nm in the respective next stage blocks 300, 21, 22, . . . , 2n do not include predischarge elements, all the circuits 301a, 301b, . . . , 301m, 201a, 201b, . . . , 201m, 202a, 202b, . . . , 202m, . . . , 20na, 20nb, . . . , 20nm are predischarged by predischarging the previous block. Therefore, in view of the area of the entire circuit, although the area increases by the area of the predischarge data input circuit 35, since a lot of dynamic circuits 301a, 301b, . . . , 301m, 201a, 201b, . . . , 201m, 202a, 202b, . . . , 202m, . . . , 20na, 20nb, . . . , 20nm are simplified, the circuit area can be reduced. Further, since a malfunction can be eliminated from the circuit, the reliability of the circuit can be improved. Moreover, since the first stage block does not require predischarge elements, the loads on the respective intermediate nodes are reduced, and thus the speed of the circuit operation can be further heightened. In this example, there is no difference between the first stage block 300 and the next stage blocks 21, 22, . . . , 2n, but they are specified for convenience of the description.

Third Embodiment

Figure 12:
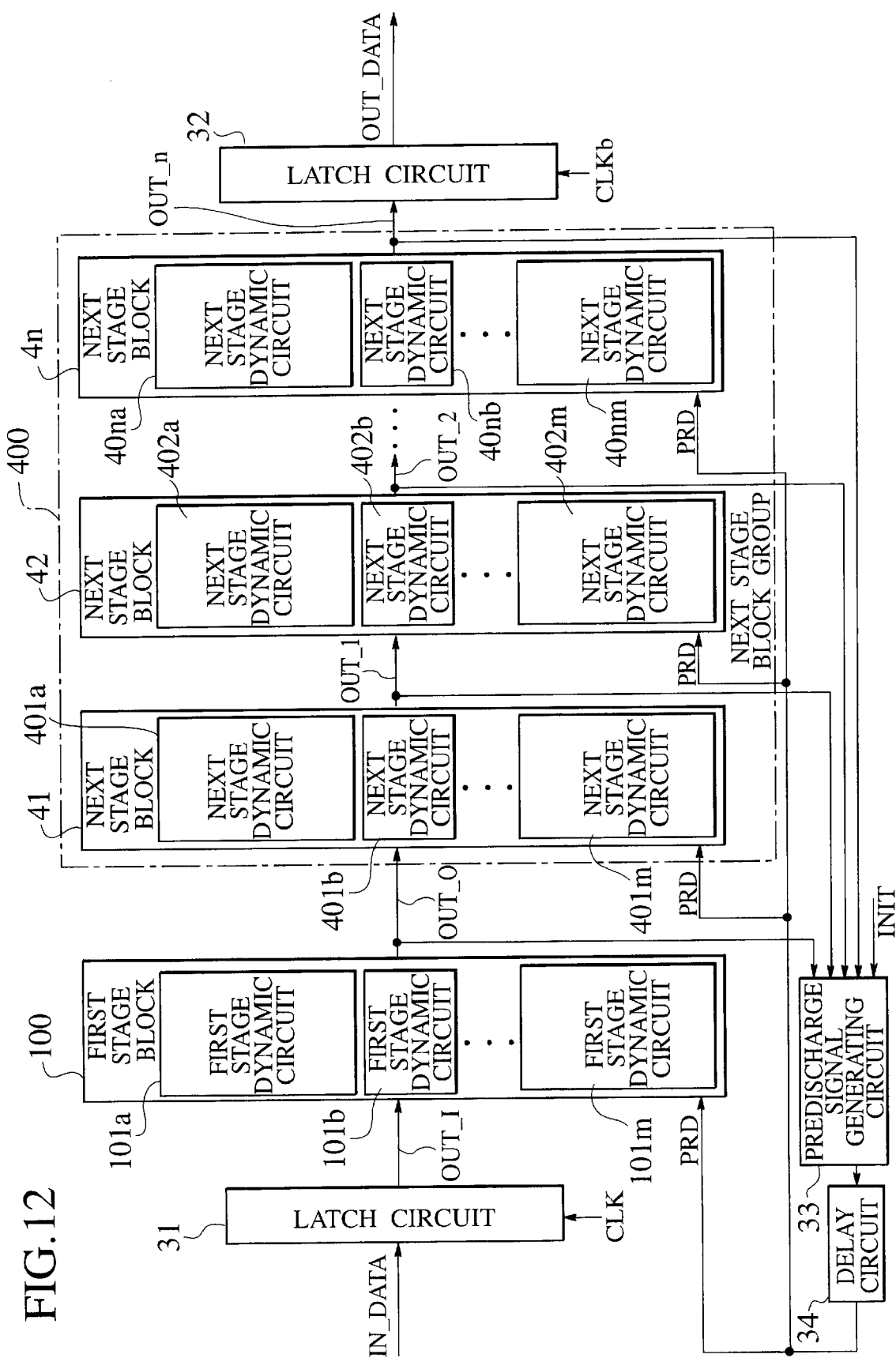
FIG. 12 is a schematic configuration showing an example of the semiconductor circuit according to a third embodiment.
Figure 13A:
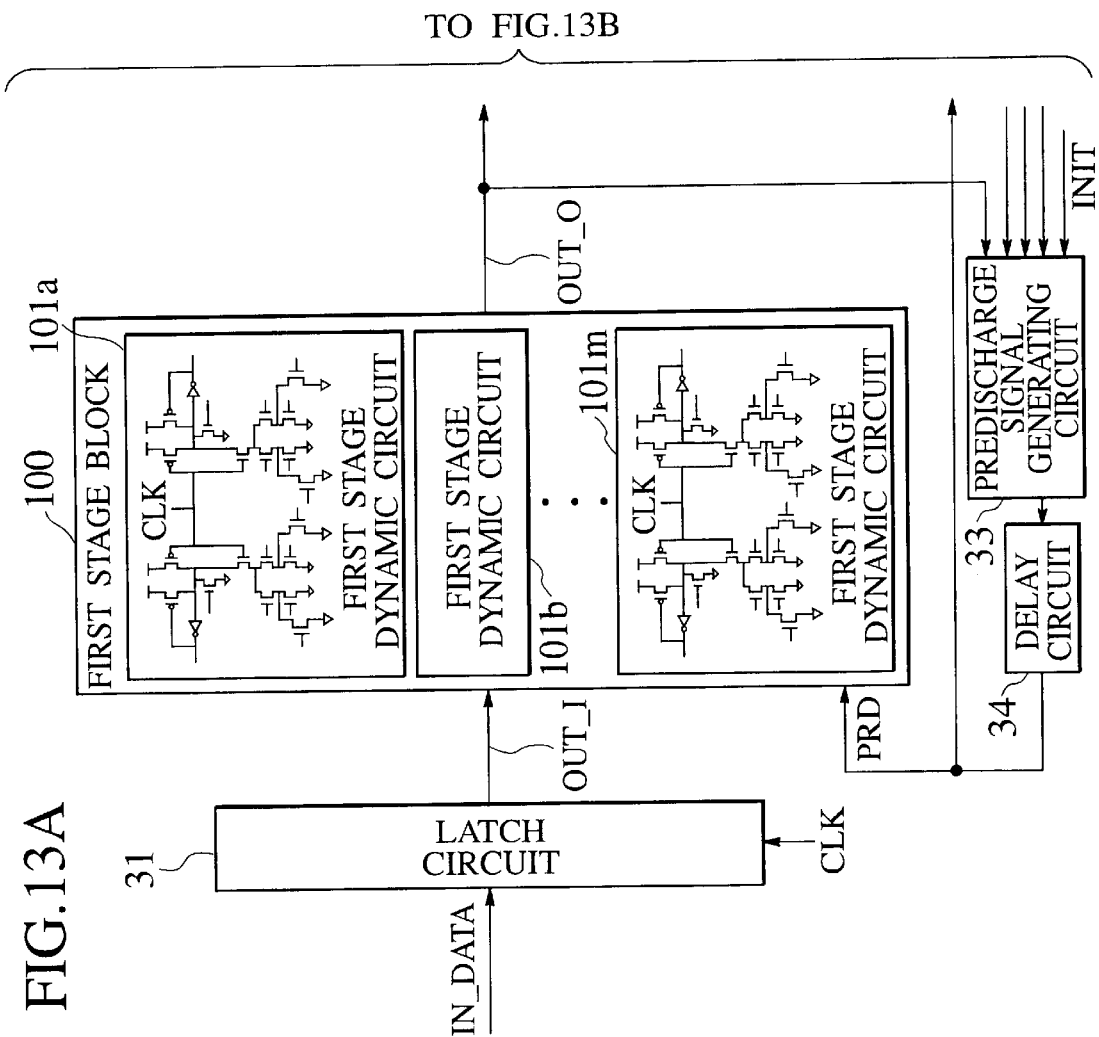
FIG. 13A is a schematic configuration showing an example of an input side latch circuit, a first stage block, a predischarge signal generating circuit, and a delay circuit in the semiconductor circuit shown in FIG. 12.

As shown in FIGS. 12, 13A, and 13B, a semiconductor circuit according to a third embodiment includes a first stage block 100, a next stage block group 400 which is cascade connected with the first stage block 100, an input side latch circuit 31, an output side latch circuit 32, a predischarge signal generating circuit 33 and a delay circuit 34. Further, a predischarge signal PRD output from the delay circuit 34 is input into respective first stage dynamic circuits 101a, 101b, . . . , 101m in the first stage block 100 and next stage dynamic circuits 401a, 401b, . . . , 401m, 402a, 402b, . . . , 402m, . . . , 40na, 40nb, . . . , 40nm in respective next stage blocks 41, 42, . . . , 4n.

The first stage dynamic circuits 101a, 101b, . . . , 101m are constituted the same as the first stage dynamic circuits 101a, 101b, . . . , 101m according to the first embodiment shown in FIG. 5.

Besides the next stage dynamic circuits 401a, 401b, . . . , 401m, 402a, 402b, . . . , 402m, . . . , 40na, 40nb, . . . , 40nm in the respective next stage blocks 41, 42, . . . , 4n including the predischarge n-channel transistors Q13 and Q33, the next stage dynamic circuits 401a, 401b, . . . , 401m, 402a, 402b, . . . , 402m, . . . , 40na, 40nb, . . . , 40nm are constituted the same as the the next stage dynamic circuits 201a, 201b, . . . , 201m, 202a, 202b, . . . , 202m, . . . , 20na, 20nb, . . . , 20nm according to the first embodiment shown in FIGS. 6 and 7.

Figure 14:
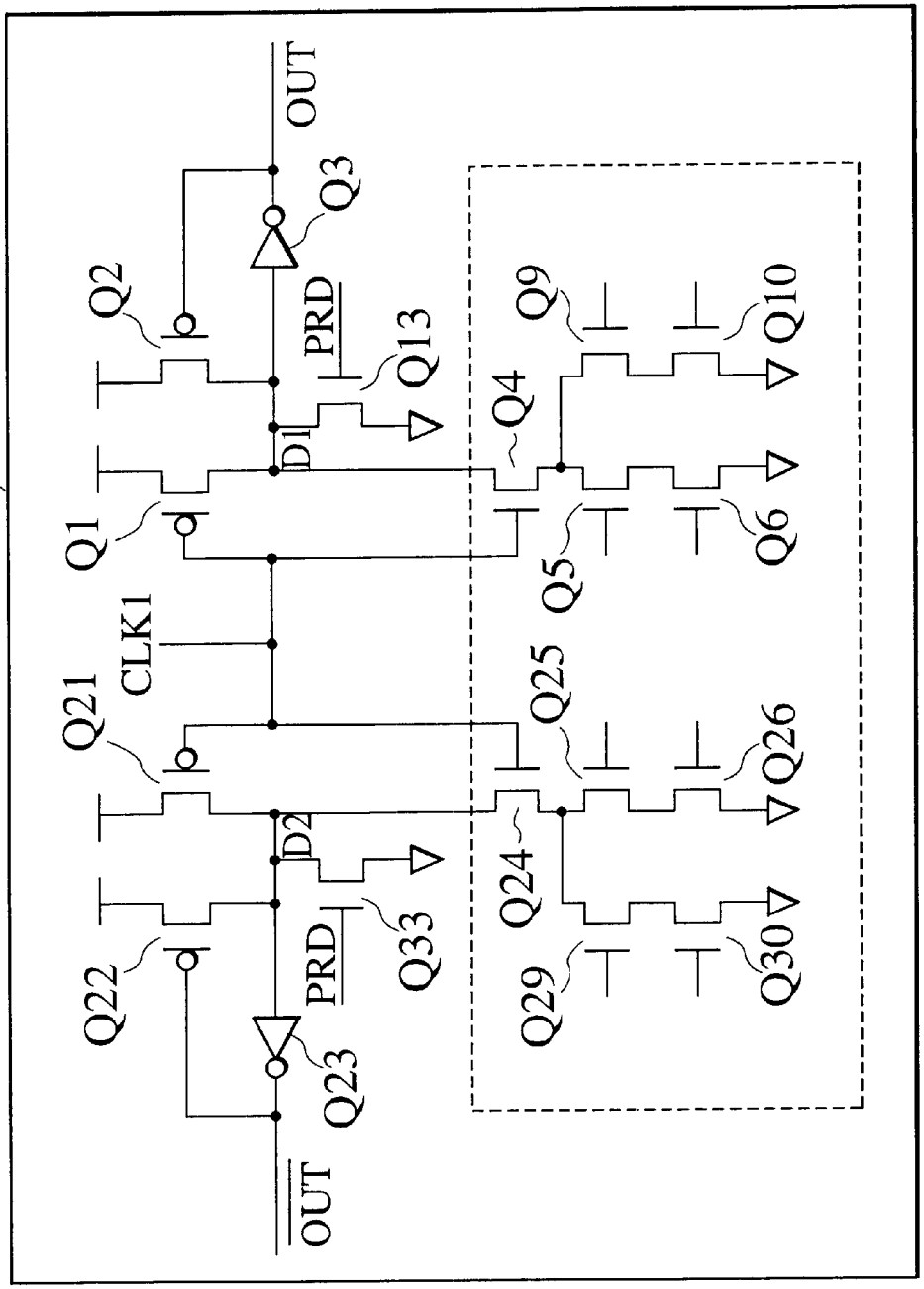
FIG. 14 is a schematic configuration showing an example of a next stage dynamic circuit composing a top block of the next stage block group in the semiconductor circuit shown in FIG. 12.

Namely, as shown in FIG. 14, each of next stage dynamic circuit 401a, 401b, . . . , 401m is implemented by an inverter Q3 as the output driver, p-channel transistors Q1 and Q2 connected to the input side of the inverter Q3, and a logic circuit section configured by connecting n-channel transistors Q4, Q5, Q6, Q9 and Q10 in series. Further, the next stage dynamic circuits 401a, 401b, . . . , 401m is organized by an inverter Q23 as the output driver for output (bar OUT) inverted from the output of inverter Q3, p-channel transistors Q21 and Q22 connected to the input side of the inverter Q23, and a logic circuit section configured by connecting n-channel transistors Q24, Q25, Q26, Q29 and Q30 in series.

The p-channel transistor Q1 of the next stage dynamic circuits 401a, 401b, . . . , 401m functions as a precharge circuit for precharging a dynamic node D1 on the input side of the inverter Q3 with a predetermined cycle. The p-channel transistor Q2 of the next stage dynamic circuits 401a, 401b, . . . , 401m is a leaker for maintaining the electric potential of the dynamic node D1. Similarly, the p-channel transistor Q21 of the next stage dynamic circuits 401a, 401b, 401m functions as a precharge circuit for precharging a dynamic node D2 on the input side of the inverter Q23 with a predetermined cycle. The p-channel transistor Q22 of the next stage dynamic circuits 401a, 401b, . . . , 401m is a leaker for maintaining the electric potential of the dynamic node D2. Further, n-channel transistors Q13 and Q33 which are predischarge elements for predischarging the respective dynamic nodes D1, D2 are connected respectively to the dynamic nodes in the next stage dynamic circuits 401a, 401b, . . . , 401m. The n-channel transistor Q13 of the next stage dynamic circuits 401a, 401b, . . . , 401m predischarges the input side node D1 of the inverter Q3. The n-channel transistor Q33 of the next stage dynamic circuits 401a, 401b, . . . , 401m predischarges the input side node D2 of the inverter Q23.

An operation of the semiconductor circuit will be explained below according to the third embodiment. The operation of the semiconductor circuit in the third embodiment is the same as the operation of the first stage dynamic circuits 101a, 101b, . . . , 101m in the first embodiment.

A predischarge signal PRD at a high level is output from the predischarge signal generating circuit 33 using an initializing signal INIT or a processed result OUT_0 as the trigger, the signal PRD is delayed by the delay circuit 34 so as to be input into both of the respective first stage dynamic circuits 101a, 101b, . . . , 101m in the first stage block 100 and next stage dynamic circuits 401a, 401b, . . . , 401m, 402a, 402b, . . . , 402m, . . . , 40na, 40nb, . . . , 40nm in the respective next stage blocks 41, 42, . . . , 4n.

As a result, predischarge n-channel transistors Q13 and Q23 of the respective first stage dynamic circuits 10a, 101b, . . . , 101m in the first stage block 100 and the predischarge n-channel transistors Q13 and Q23 of the respective next stage dynamic circuits 401a, 401b, . . . , 401m, 402a, 402b, . . . , 402m, . . . , 40na, 40nb, . . . , 40nm in the respective next stage blocks 41, 42, . . . , 4n are actuated (ON), and the input side nodes D1, D2 of inverters Q3, Q23 of the first stage dynamic circuits 101a, 101b, . . . , 101m and the input side nodes D1, D2 of the inverters Q3, Q23 of the next stage dynamic circuits 401a, 401b, . . . , 401m, 402a, 402b, . . . , 402m, . . . , 40na, 40nb, . . . , 40nm are predischarged to a low level. And simultaneously predischarge n-channel transistors Q11, Q12, Q21 and Q22 of the respective first stage dynamic circuits 101a, 101b, ..., 101m are actuated (ON), so that intermediate nodes of n-channel transistors Q5, Q6, Q15 and Q26 and intermediate nodes of n-channel transistors Q9, Q10, Q29 and Q30 composing a logic circuit section of respective first stage dynamic circuits 101a, 101b, ..., 101m are predischarged to a low level. For this reason, all the dynamic circuits 101a, 101b, ..., 10m, 401a, 401b, ..., 401m, 402a, 402b, ..., 402m, ..., 40na, 40nb, ..., 40nm in all the next stage blocks 100, 41, 42, ..., 4n are predischarged simultaneously.

Thereafter, the clock signal CLK is pulled down to a low level, and all the dynamic circuits 101a, 101b, ..., 101m, 401a, 401b, ..., 401m, 402a, 402b, ..., 402m, ..., 40na, 40nb, ..., 40nm in the respective blocks 100, 41, 42, ..., 4n are precharged sequentially. The outputs OUT_0, OUT_1, ..., OUT_n in the respective blocks 100, 41, 42, ..., 4n are pulled down to a low level, so that the blocks wait for input of data.

When the data processed result of the dynamic circuits 40na, 40nb, ..., 40nm in the next stage block 2n (last block) is output, the predischarge signal generating circuit 33 generates a next predischarge signal at a high level, and its delay signal is output simultaneously to all the dynamic circuits 101a, 101b, ..., 101m, 401a, 401b, ..., 401m, 402a, 402b, ..., 402m, ..., 40na, 40nb, ..., 40nm in the respective blocks 100, 41, 42, ..., 4n as mentioned above, so that the above operation is repeated. When the power source is turned on, an initializing signal is input into the predischarge signal generating circuit 33, so that the first predischarge signal at a high level is generated.

According to the present embodiment, since all the blocks include the dynamic circuits 101a, 101b, ..., 101m, 401a, 401b, ..., 401m, ..., 402a, 402b, ..., 402m, ..., 40na, 40nb, ..., 40nm including predischarge elements, all the dynamic circuits 101a, 101b, ..., 101m, 401a, 401b, ..., 401m, 402a, 402b, ..., 402m, ..., 40na, 40nb, ..., 40nm in all the blocks 100, 41, 42, ..., 4n can be predischarged simultaneously. For this reason, the predischarge period can be shortened.

The predischarge signal generating circuit 33 uses not only the data processed result OUT_n of the last stage block 2n but also at least one or more of data processed results OUT_0, OUT_1, ..., OUT_n in arbitrary block 100, 41, 42, ..., 4n as the trigger for generating the predischarge signal.

As detailed in the first to third embodiments, a malfunction can be eliminated from the circuit and the reliability of the circuit can be improved without increasing the layout area.

Although the embodiments of the present invention have been described in detail, the invention may be embodied in other specific forms without departing from the spirit or essential characteristics thereof. The present embodiment is therefore to be considered in all respects as illustrative and not restrictive, the scope of the invention being indicated by the appended claims rather than by the foregoing description and all changes which come within the meaning and range of equivalency of the claims are therefore intended to be embraced therein.

What is claimed is:

1. A semiconductor circuit comprising:
a first stage block including a plurality of first stage dynamic circuits and configured to output a predischarged result of the respective first stage dynamic circuits to blocks cascade connected to later stages, each of the first stage dynamic circuit includes predischarge elements connected respectively to dynamic nodes of the respective first stage dynamic circuits to predischarge the dynamic nodes, configured such that the dynamic nodes of the respective first stage dynamic circuits are precharged with a predetermined cycle;
a predischarge signal generating circuit configured to generate a predischarge signal to actuate the respective predischarge elements before precharge timing of the respective dynamic nodes of the respective first stage dynamic circuits; and
at least more than one next stage blocks including a plurality of next stage dynamic circuits and configured to output predischarge results of the respective next stage dynamic circuits sequentially to blocks cascade connected to later stages, each of the next stage dynamic circuit configured to input the predischarge result of the previous block so as to predischarge dynamic nodes of the respective next stage dynamic circuits, configured such that the dynamic nodes of the respective next stage dynamic circuits are precharged with a predetermined cycle.

2. The semiconductor circuit of claim 1, wherein said predischarge signal generating circuit generates the predischarge signal using processed result data output from one arbitrary block of the first stage block to the next stage blocks and an initializing signal to initialize the semiconductor circuit as a trigger.

3. The semiconductor circuit of claim 1, further comprising
a delay circuit configured to delay the predischarge signal to be generated by the predischarge signal generating circuit by a predetermined time period, and to output the delayed predischarge signal to the first stage block.

4. A semiconductor circuit comprising:
a first stage block including a plurality of first stage dynamic circuits and configured to output a predischarge result in the respective first stage dynamic circuits to blocks cascade connected to later stages, each of the first stage dynamic circuit configured to input predischarge data so as to predischarge dynamic nodes of the respective first stage dynamic circuits, configured such that the dynamic nodes of the respective first stage dynamic circuits are precharged with a predetermined cycle and;
a predischarge data input circuit configured to generate the predischarge data and to input the predischarge data into the first stage block;
a predischarge signal generating circuit configured to generate a predischarge signal to actuate the predischarge data input circuit before precharge timing of the respective dynamic nodes of the respective first stage dynamic circuits; and
at least more than one next stage blocks including a plurality of next stage dynamic circuits and configured to output predischarge results of the respective next stage dynamic circuits sequentially to blocks cascade connected to later stages, each of the next stage dynamic circuit configured to input the predischarge result of the previous block so as to predischarge dynamic nodes of the respective next stage dynamic circuits, configured such that the dynamic nodes of the respective next stage dynamic circuits are precharged with a predetermined cycle.

5. The semiconductor circuit of claim 4, wherein said predischarge signal generating circuit generates the predischarge signal using processed result data output from one arbitrary block of the first stage block to the next stage blocks and an initializing signal to initialize the semiconductor circuit as a trigger.

6. The semiconductor circuit of claim 4, further comprising
a delay circuit configured to delay the predischarge signal to be generated by the predischarge signal generating circuit by a predetermined time period and to output the delayed predischarge signal to the predischarge data input circuit.

7. A semiconductor circuit comprising:
a first stage block including a plurality of first stage dynamic circuits, each of the first stage dynamic circuit includes predischarge elements connected respectively to dynamic nodes of the respective first stage dynamic circuits to predischarge the dynamic nodes, configured such that the dynamic nodes of the respective first stage dynamic circuits are precharged with a predetermined cycle;
at least more than one next stage blocks including a plurality of next stage dynamic circuits, each of the next stage dynamic circuit includes predischarge elements connected respectively to dynamic nodes of the respective next stage dynamic circuits to predischarge the dynamic nodes, configured such that the dynamic nodes of the respective next stage dynamic circuits are precharged with a predetermined cycle; and
a predischarge signal generating circuit configured to generate a predischarge signal to actuate the respective predischarge elements of the respective first stage dynamic circuits and the respective next stage dynamic circuits before precharge timing of the respective dynamic nodes of the respective first stage dynamic circuits and the respective next stage dynamic circuits.

8. The semiconductor circuit of claim 7, wherein
said predischarge signal generating circuit generates the predischarge signal using processed result data output from one arbitrary block of the first stage block to the next stage blocks and an initializing signal to initialize the semiconductor circuit as a trigger.

9. The semiconductor circuit of claim 7, further comprising
a delay circuit configured to delay the predischarge signal to be generated by the predischarge signal generating circuit by a predetermined time period and to output the delayed predischarge signal to the first stage block and the next stage blocks.

10. A method for predischarging a semiconductor circuit, the semiconductor circuit configured such that plural-stage blocks including a plurality of dynamic circuits are cascade connected and dynamic nodes of the respective dynamic circuits are precharged with a predetermined cycle, the method comprising:
generating a predischarge signal to actuate predischarge elements for predischarging the respective dynamic nodes before precharge timing of the respective dynamic nodes in a first stage block of the plural-stage blocks;
inputting the predischarge signal to predischarge the respective dynamic nodes in the first stage block;
outputting a predischarge result in the first stage block to a block cascade connected to a later stage; and
inputting the predischarge result to predischarge the respective dynamic nodes in a next stage block of the plural-stage blocks and outputting the predischarge result to a later stage block where the later stage block is cascade connected.

11. The method of claim 10, wherein
the predischarge signal is generated using processed result data output from one arbitrary block of the first stage block to the next stage blocks and an initializing signal to initialize the semiconductor circuit as a trigger.

12. The method of claim 10, wherein
when the generated predischarge signal is input into the first stage block, the predischarge signal is delayed by a predetermined time period so as to be input into the first stage block.

13. A method for predischarging a semiconductor circuit, the semiconductor circuit configured such that plural-stage blocks including a plurality of dynamic circuits are cascade connected and dynamic nodes of the respective dynamic circuits are precharged with a predetermined cycle, the method comprising:
generating a predischarge signal before precharge timing of the respective dynamic nodes in a first stage blocks of the plural-stage blocks and creating predischarge data to predischarge the respective dynamic nodes;
inputting the predischarge data to predischarge the respective dynamic nodes in the first stage block;
outputting a predischarge result in the first stage block to a block cascade connected to a later stage; and
inputting the predischarge result to predischarge the respective dynamic nodes in a next stage block of the plural-stage blocks and outputting the predischarge result to a later stage block where the later stage block is cascade connected.

14. The method of claim 13, wherein
the predischarge signal is generated using processed result data output from one arbitrary block of the first stage block to the next stage blocks and an initializing signal to initialize the semiconductor circuit as a trigger.

15. The method of claim 13, wherein
when the generated predischarge signal is input into the first stage block, the predischarge signal is delayed by a predetermined time period so as to be input into the first stage block.

16. A method for predischarging a semiconductor circuit, the semiconductor circuit configured such that plural-stage blocks including a plurality of dynamic circuits are cascade connected and dynamic nodes of the respective dynamic circuits are precharged with a predetermined cycle, the method comprising:
generating a predischarge signal to actuate predischarge elements for predischarging the respective dynamic nodes before precharge timing of the respective dynamic nodes in the all plural-stage blocks; and
inputting the predischarge signal to predischarge the respective dynamic nodes in the all blocks.

17. The method of claim 16, wherein
the predischarge signal is generated using processed result data output from one arbitrary block of the all blocks and an initializing signal to initialize the semiconductor circuit as a trigger.

18. The method of claim 16, wherein
when the generated predischarge signal is input into the all blocks, the predischarge signal is delayed by a predetermined time period so as to be input into the all blocks.

* * * * *